(12) United States Patent
Lee et al.

(10) Patent No.: US 11,322,544 B2
(45) Date of Patent: May 3, 2022

(54) SEMICONDUCTOR DEVICE WITH FIRST AND SECOND DATA STRUCTURES

(71) Applicant: SAMSUNG ELECTRONICS CO., LTD., Suwon-si (KR)

(72) Inventors: Kyunghwan Lee, Suwon-si (KR); Yongseok Kim, Suwon-si (KR); Taehun Kim, Suwon-si (KR); Seokhan Park, Suwon-si (KR); Satoru Yamada, Suwon-si (KR); Jaeho Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 305 days.

(21) Appl. No.: 16/734,937

(22) Filed: Jan. 6, 2020

(65) Prior Publication Data
US 2020/0395412 A1 Dec. 17, 2020

(30) Foreign Application Priority Data
Jun. 12, 2019 (KR) .................... 10-2019-0069038

(51) Int. Cl.
*H01L 27/24* (2006.01)
*G11C 16/10* (2006.01)
(Continued)

(52) U.S. Cl.
CPC ........ *H01L 27/2454* (2013.01); *G11C 13/004* (2013.01); *G11C 13/0004* (2013.01);
(Continued)

(58) Field of Classification Search
CPC .......... H01L 27/2454; H01L 27/11524; H01L 27/1157; H01L 45/06; H01L 45/14; H01L 29/40117; H01L 45/1233; H01L 27/2481; H01L 29/7926; H01L 45/04; H01L 45/146; H01L 45/147; H01L 27/11568; H01L 27/11578; H01L 27/11556; H01L 29/66825; H01L 29/7889; G11C 13/0004;
(Continued)

(56) References Cited

U.S. PATENT DOCUMENTS 7,639,524 B2   12/2009   Kang et al.
8,207,518 B2    6/2012   Kubo et al.
(Continued)

FOREIGN PATENT DOCUMENTS

JP   5351144      8/2013
KR   10-682925    2/2007
(Continued)

*Primary Examiner* — Jerome Leboeuf
(74) *Attorney, Agent, or Firm* — F. Chau & Associates, LLC

(57) ABSTRACT

A vertical semiconductor device includes: a channel on a substrate, the channel extending in a first direction substantially perpendicular to an upper surface of the substrate; a first data storage structure contacting a first sidewall of the channel; a second data storage structure on a second sidewall of the channel; and gate patterns on a surface of the second data storage structure, wherein the gate patterns are spaced apart from each other in the first direction, and the gate patterns extend in a second direction substantially parallel to the upper surface of the substrate.

20 Claims, 27 Drawing Sheets

(51) Int. Cl.
*G11C 16/26* (2006.01)
*G11C 13/00* (2006.01)
*H01L 45/00* (2006.01)
*H01L 27/11524* (2017.01)
*H01L 27/1157* (2017.01)

(52) U.S. Cl.
CPC ...... *G11C 13/0007* (2013.01); *G11C 13/0069* (2013.01); *G11C 16/10* (2013.01); *G11C 16/26* (2013.01); *H01L 27/1157* (2013.01); *H01L 27/11524* (2013.01); *H01L 45/06* (2013.01); *H01L 45/14* (2013.01); *G11C 2013/0045* (2013.01); *G11C 2013/0078* (2013.01)

(58) Field of Classification Search
CPC .............. G11C 13/0007; G11C 13/004; G11C 13/0069; G11C 16/10; G11C 16/26; G11C 2013/0045; G11C 2013/0078; G11C 13/0064; G11C 2213/15; G11C 11/5685; G11C 11/5678; G11C 13/0097
See application file for complete search history.

(56) References Cited

U.S. PATENT DOCUMENTS

| | | | |
|---|---|---|---|
| 8,980,709 | B2 | 3/2015 | Chiang et al. |
| 9,093,369 | B2 | 7/2015 | Shin et al. |
| 9,747,976 | B2 | 8/2017 | Jackson et al. |
| 2010/0065803 | A1 | 3/2010 | Choi et al. |
| 2017/0069390 | A1* | 3/2017 | Nam ................ G11C 16/10 |
| 2018/0025783 | A1* | 1/2018 | Choi ................ G11C 16/10 365/185.23 |
| 2018/0268970 | A1 | 9/2018 | Ham et al. |
| 2021/0020203 | A1* | 1/2021 | Choi ................ H01L 27/11582 |

FOREIGN PATENT DOCUMENTS

KR        10-1871002        6/2018
KR        10-2018-0106868        10/2018

* cited by examiner

SEMICONDUCTOR DEVICE WITH FIRST AND SECOND DATA STRUCTURES

CROSS-REFERENCE TO RELATED APPLICATION

This application claims priority under 35 U.S.C. § 119 to Korean Patent Application No. 10-2019-0069038, filed on Jun. 12, 2019, in the Korean Intellectual Property Office (KIPO), the disclosure of which is incorporated by reference herein in its entirety.

1. Technical Field

Exemplary embodiments of the inventive concept relate to a semiconductor device including memory cells storing data of multiple-bits and a method of operating the semiconductor device.

2. Description of the Related Art

In an effort to increase a storage capacity of a semiconductor device, a multi level cell (MLC) for storing data of at least two bits in one memory cell has been developed. Examples of the MLC include a triple level cell that stores 3-bit data, a quad level cell that stores 4-bit data, or a penta level cell that stores 5-bit data. Therefore, methods of storing data of multiple-bits in the one memory cell and methods of reading the stored data from the memory cell without errors are under development.

SUMMARY

According to an exemplary embodiment of the inventive concept, there is provided a vertical semiconductor device including a channel on a substrate, the channel extending in a first direction substantially perpendicular to an upper surface of the substrate; a first data storage structure contacting a first sidewall of the channel; a second data storage structure on a second sidewall of the channel; and gate patterns on a surface of the second data storage structure, wherein the gate patterns are spaced apart from each other in the first direction, and the gate patterns extend in a second direction substantially parallel to the upper surface of the substrate.

According to an exemplary embodiment of the inventive concept, there is provided a vertical semiconductor device including gate patterns stacked on a substrate, wherein the gate patterns are spaced apart from each other in a first direction substantially perpendicular to an upper surface of the substrate, and the gate patterns extend in a second direction substantially parallel to the upper surface of the substrate; a channel passing through the gate patterns, wherein the channel is electrically connected to the substrate, and the channel has a cylindrical shape; a first data storage structure contacting a first sidewall of the channel; and a second data storage structure on a second sidewall of the channel opposite the first sidewall, wherein the second data storage structure contacts the channel.

According to an exemplary embodiment of the inventive concept, there is provided a vertical semiconductor device including a channel on a substrate; a first data storage structure formed on a first side of the channel; a second data storage structure formed on a second side opposite to the first side of the channel; and gate patterns on the second data storage structure.

According to an exemplary embodiment of the inventive concept, there is provided a method of operating a semiconductor device. The method may include storing first data in a first data storage structure of the semiconductor device, the semiconductor device comprising memory cells, each of the memory cells including the first data storage structure and a second data storage structure; storing second data in the second data storage structure; reading the first data; and reading the second data.

According to an exemplary embodiment of the inventive concept, a vertical semiconductor device includes: a first gate pattern and a second gate pattern arranged in a vertical direction on a substrate, wherein an insulation layer is disposed between the first gate pattern and the second gate pattern; a channel layer disposed on the substrate; a first data storage element disposed on a first side of the channel layer; and a second data storage element disposed on a second side of the channel layer, wherein the second data storage element is disposed between the second side of the channel layer and the first gate pattern.

DETAILED DESCRIPTION OF THE EMBODIMENTS

Exemplary embodiments of the inventive concept will be more clearly understood from the following detailed description taken in conjunction with the accompanying drawings.

Hereinafter, a direction substantially perpendicular to an upper surface of a substrate may be a first direction. A direction substantially parallel to the upper surface of the substrate may be a second direction, and a direction substantially perpendicular to the second direction and substantially parallel to the upper surface of the substrate may be a third direction.

Figure 1:
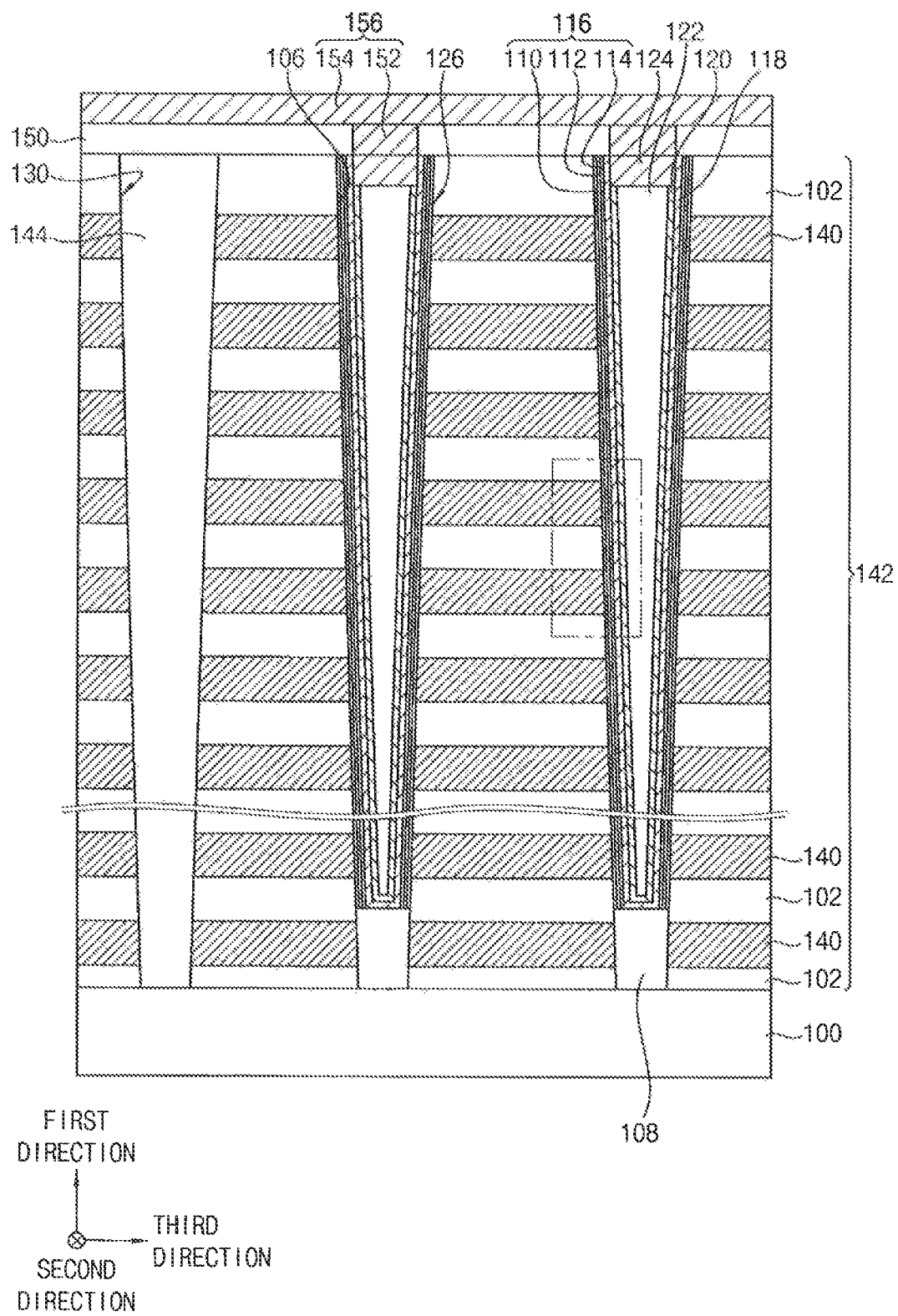
FIG. 1 is a cross-sectional view illustrating a vertical semiconductor device in accordance with an exemplary embodiment of the inventive concept.
Figure 2A:
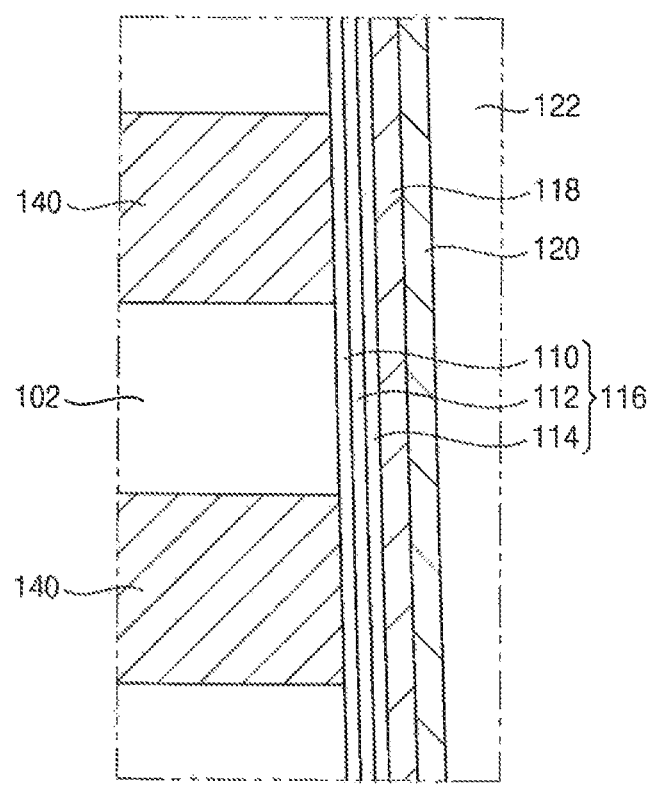
FIGS. 2A, 2B and 2C are enlarged cross-sectional views of memory cells of vertical semiconductor devices in accordance with exemplary embodiments of the inventive concept.
Figure 2B:
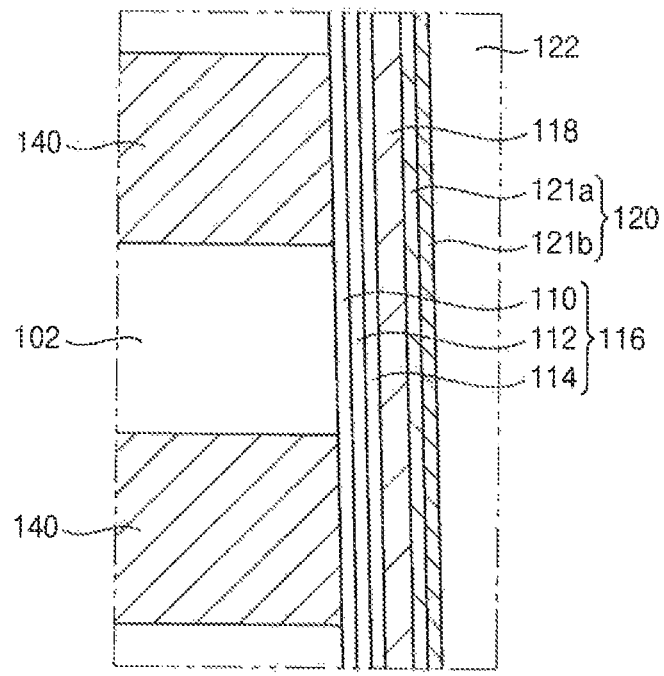
Figure 2C:
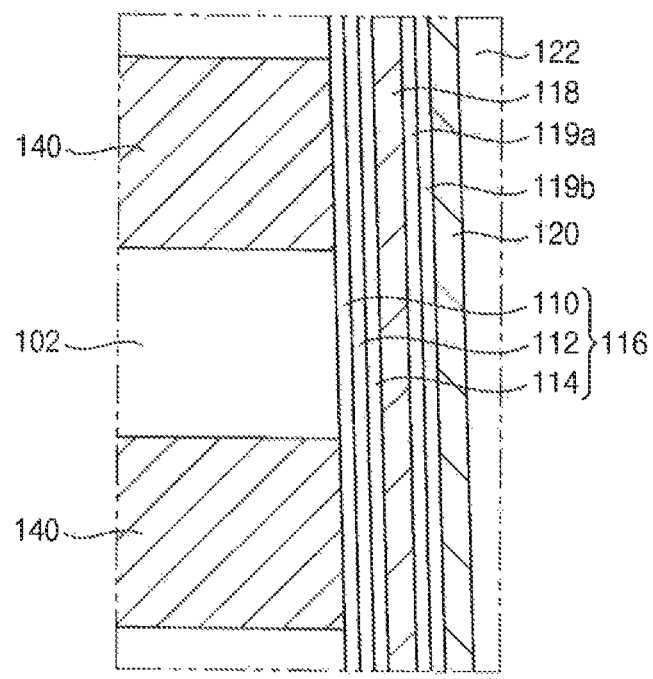
Figure 3:
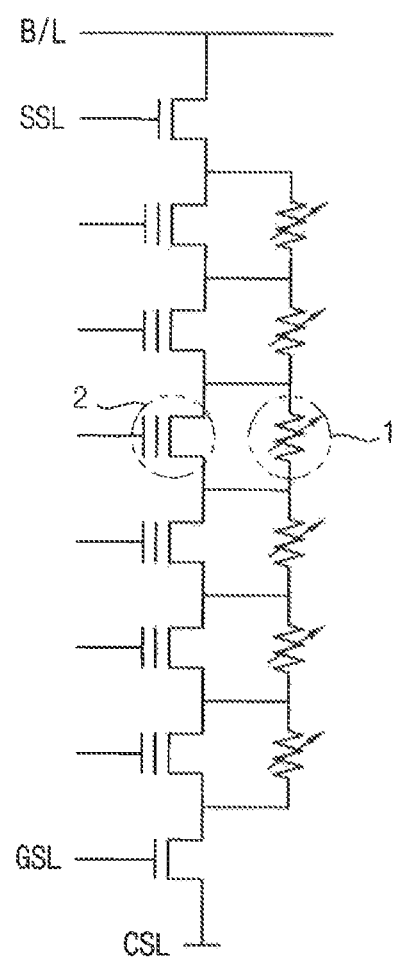
FIG. 3 is a circuit diagram of memory cells of a vertical semiconductor device in accordance with an exemplary embodiment of the inventive concept.

FIG. 1 is a cross-sectional view illustrating a vertical semiconductor device in accordance with an exemplary embodiment of the inventive concept. FIGS. 2A, 2B and 2C are enlarged cross-sectional views of memory cells of vertical semiconductor devices in accordance with exemplary embodiments of the inventive concept. FIG. 3 is a circuit diagram of memory cells of a vertical semiconductor device in accordance with an exemplary embodiment of the inventive concept.

Referring to FIGS. 1, 2A, and 3, the vertical semiconductor device may include a stacked structure 142 formed on a substrate 100 and vertical structures 126 including a channel and passing through the stacked structure 142. Further, a bit line structure 156 may be formed on the stacked structure 142. The bit line structure 156 may be electrically connected to a channel 118 of the vertical structures 126.

The substrate 100 may include a semiconductor material, e.g., silicon, germanium, silicon-germanium, or III-V semiconductor compounds, e.g., GaP, GaAs, GaSb, etc. In exemplary embodiments of the inventive concept, the substrate 100 may be a silicon-on-insulator (SOI) substrate or a germanium-on-insulator (GOI) substrate.

The stacked structure 142 may include insulation layers 102 and gate patterns 140 alternately and repeatedly stacked. Thus, the gate patterns 140 may be spaced apart from each other in the first direction.

The gate patterns 140 may serve as gates of cell transistors. In exemplary embodiments of the inventive concept, at least one gate pattern formed at a lowermost layer may serve as a gate of a ground selection transistor, and at least one gate pattern formed at an uppermost layer may serve as a gate of a string selection transistor.

An upper insulation layer 150 may be formed on the stacked structure 142. The stacked structure 142 may extend in the second direction. A plurality of stacked structures 142 may be arranged in the third direction, and a first trench 130 extending in the second direction may be formed between the stacked structures 142.

In exemplary embodiments of the inventive concept, an insulation pattern 144 may fill the first trench 130.

In exemplary embodiments of the inventive concept, a common source line extending in the second direction may be formed in the first trench 130, and the common source line may be insulated from a sidewall of the stacked structure 142.

In exemplary embodiments of the inventive concept, the gate pattern 140 may include a barrier layer and a gate conductive layer. The gate conductive layer may include a metal having an excellent gap filling property and low resistance. The gate conductive layer may include, e.g., tungsten, titanium, tantalum, platinum, or the like. The barrier layer may include, e.g., a metal nitride such as tungsten nitride, titanium nitride, tantalum nitride, or the like.

The vertical structure 126 may pass through the stacked structure 142, and may have a pillar shape. The vertical structure 126 may be formed in the channel hole 106 passing through the stacked structure 142 and extending to an upper surface of the substrate 100.

In exemplary embodiments of the inventive concept, a semiconductor pattern 108 may be formed on a lower surface of the channel hole 106, and the semiconductor pattern 108 may contact the upper surface of the substrate 100.

In exemplary embodiments of the inventive concept, the semiconductor pattern 108 may not be formed. In this case, a channel connection pattern may be formed on the substrate 100 to be electrically connected to the channels 118 and the substrate 100. The channel connection pattern may surround a lower portion of each of channels 118 in the vertical structures 126.

The vertical structure 126 may include a second data storage structure 116, a channel 118, a first data storage structure 120, a filling insulation pattern 122 and an upper conductive pattern 124. The second data storage structure 116, the channel 118, the first data storage structure 120 and the filling insulation pattern 122 may be sequentially stacked on a sidewall of the channel hole 106. The upper conductive pattern 124 may be formed at an upper portion of on the channel hole 106 to be electrically connected to the channel 118.

The second data storage structure 116 may include a blocking layer 110, a charge storage layer 112 and a tunnel insulation layer 114 sequentially stacked on the sidewall of the channel hole 106. The blocking layer 110 may contact the gate pattern 140.

In exemplary embodiments of the inventive concept, the tunnel insulation layer 114 and the blocking layer 110 may include silicon oxide.

In exemplary embodiments of the inventive concept, the charge storage layer 112 may include a charge trap layer or a charge floating layer.

For example, when data is stored in the charge storage layer 112 by trapped charges in the charge storage layer 112, the charge storage layer 112 may include silicon nitride, metal oxide, and the like. The metal oxide may include, e.g., aluminum oxide. For example, when data is stored in the charge storage layer 112 by floating charges in the charge storage layer 112, the charge storage layer 112 may include silicon. The charge storage layer 112 may include, e.g., doped silicon, undoped silicon, and the like.

The channel 118 may contact the tunnel insulation layer 114, and may be electrically connected to the substrate 100. In exemplary embodiments of the inventive concept, the channel 118 may have a cylindrical shape within the channel hole 106. In addition, a lower surface of the channel 118 may contact an upper surface of the semiconductor pattern 108. In exemplary embodiments of the inventive concept, the channel 118 may include polysilicon.

The first data storage structure 120 may be formed on an inner sidewall of the channel 118. In exemplary embodiments of the inventive concept, the first data storage structure 120 may cover the inner sidewall of the channel 118. The first data storage structure 120 may extend in the first direction. For example, the first data storage structure 120 may have a cylindrical shape.

The first data storage structure 120 may include a variable resistance material. In other words, data may be written in the first data storage structure 120 by changing a resistance of the first data storage structure 120.

In exemplary embodiments of the inventive concept, the first data storage structure 120 may include resistive switching materials. For example, the first data storage structure 120 may include perovskite materials, such as STO (SrTiO3), BTO (BaTiO3), PCMO (Pr1-XCaXMnO3), or metal oxides such as zirconium oxide, hafnium oxide, hafnium aluminum oxide, hafnium silicon oxide, aluminum oxide, titanium oxide, tantalum oxide, or the like.

In exemplary embodiments of the inventive concept, the first data storage structure 120 may include a phase change material whose phase may be changed to an amorphous state or a crystalline state by Joule heat. In this case, the resistance of the first data storage structure 120 may be changed by the phase transition. The phase change material may include, e.g., GST materials in which germanium (Ge), antimony (Sb), and/or tellurium (Te) may be combined at a predetermined ratio. In exemplary embodiments of the inventive concept, the first data storage structure 120 may have a superlattice structure having a repetitive stacked structure of GeTe—SbTe. In exemplary embodiments of the inventive concept, the first data storage structure 120 may include an In—Sb—Te (IST) material or a Bi—Sb—Te (BST) material.

In exemplary embodiments of the inventive concept, the first data storage structure 120 may include a GeSe material.

In exemplary embodiments of the inventive concept, the first data storage structure 120 may include a chalcogenide-based Ovonic threshold switching (OTS) material.

The filling insulation pattern 122 may be formed on the first data storage structure 120 to fill most of the remaining portions of the channel holes 106. The remaining portions of the channel holes 106 may correspond to portions of the channel holes 106 that have not already been filled with something. The filling insulation pattern 122 may include, e.g., silicon oxide. The filling insulation pattern 122 may have a pillar shape.

The first data storage structure 120, the channel 118, the second data storage structure 116, and the gate patterns 140 may be sequentially formed to surround a sidewall of the filling insulation pattern 122.

As shown in FIG. 2A, the second data storage structure 116, the channel 118, the first data storage structure 120, and the filling insulation pattern 122 sequentially stacked on the sidewall of one of the gate pattern 140 may serve as one memory cell. Thus, the memory cells may be stacked in the first direction.

A stack of layers formed on the sidewall of each of the gate patterns 140 may be variously modified.

In exemplary embodiments of the inventive concept, as shown in FIG. 2B, the first data storage structure 120 may have a structure in which two or more layers 121a and 121b may be stacked. For example, the first data storage structure 120 may include a layer 121a having a low density of oxygen vacancy at a portion contacting the channel 118 and a layer 121b having a high density of oxygen vacancy at a portion closer to the filling insulation pattern 122. The layer 121a may directly contact the channel 118 and the layer 121b may directly contact the filling insulation pattern 122.

In exemplary embodiments of the inventive concept, as shown in FIG. 2C, an interface oxide layer 119a and an amorphous oxide layer 119b may be formed between the channel 118 and the first data storage structure 120. Alternatively, the interface oxide layer 119a may not be formed. Additional filament paths may be generated along a grain boundary of the interface oxide layer 119a, so that a distribution in the first data storage structure 120 may be improved.

As described above, the one memory cell may include the first data storage structure 120 and the second data storage structure 116, respectively. Therefore, the one memory cell may include two data storage units in which data are stored in different mechanisms. For example, the one memory cell may include a first data storage unit by virtue of the first data storage structure and a second data storage unit by virtue of the second data storage structure.

A plurality of gate patterns 140 may be formed on the sidewall of the vertical structures 126 to be spaced apart from each other in the first direction. The plurality of gate patterns 140 and one of the vertical structures 126 may constitute one cell string.

Each of the memory cells included in the cell string may have a circuit configuration as shown in FIG. 3.

As shown in FIG. 3, in each of the cell strings, the channel 118 may extend in the first direction. The memory cells may be divided by the gate patterns 140 formed on the channel 118. The top of the cell string may be connected to a bit line B/L and the bottom of the cell string may be connected to a common source line CSL. In addition a transistor adjacent to the bit line B/L may be connected to a string selection line at its gate, and a transistor adjacent to the common source line CSL may be connected to a ground select line at its gate.

Cell transistors 2 including the second data storage structure 116 and the gate pattern 140 stacked may be disposed on an outer wall of the channel 118, respectively. The cell transistor 2 may serve as the second data storage unit.

Charges may be stored in the charge storage layer 112 by electric fields in a direction perpendicular to the outer sidewall of the channel 118 contacting the second data storage structure 116, and thus, data may be written in the second data storage structure 116.

For example, the charges may be injected into the charge storage layer 112 from the channel 118 by F—N tunneling, or the charges stored in the charge storage layer 112 may be erased by F—N tunneling. The charges may be stored in the charge storage layer 112 by trapping or floating. Therefore, a threshold voltage of the cell transistor 2 may be changed by the charges stored in the charge storage layer 112. Data may be distinguished by the threshold voltage of the cell transistor 2.

In exemplary embodiments of the inventive concept, the cell transistor 2 may have one of a plurality of threshold voltages in accordance with the charges stored in the charge storage layer 112. Therefore, data of one bit or multi-bits may be stored in the cell transistor 2 included in one memory cell. In other words, the threshold voltages of the second data storage structure 116 may be divided into a plurality of levels, so that data of at least two bits may be stored in the second data storage structure 116.

The first data storage structure 120 may be formed on the inner sidewall of the channel 118. The first data storage structure 120 may serve as the first data storage unit 1.

The resistance of the first data storage structure 120 may be changed by electric fields in a direction parallel to the inner sidewall of the channel 118. Data may be distinguished by a level of the resistance of the first data storage structure 120.

In exemplary embodiments of the inventive concept, the first data storage structure 120 may have one of a plurality of levels of the resistances. Therefore, data of one bit or multi-bits data may be stored in the first data storage structure 120 included in the one memory cell. In other words, the resistances of the first data storage structure 120 may be divided into the plurality of levels, so that data of at least two bits may be stored in the first storage structure 120.

Figure 4:
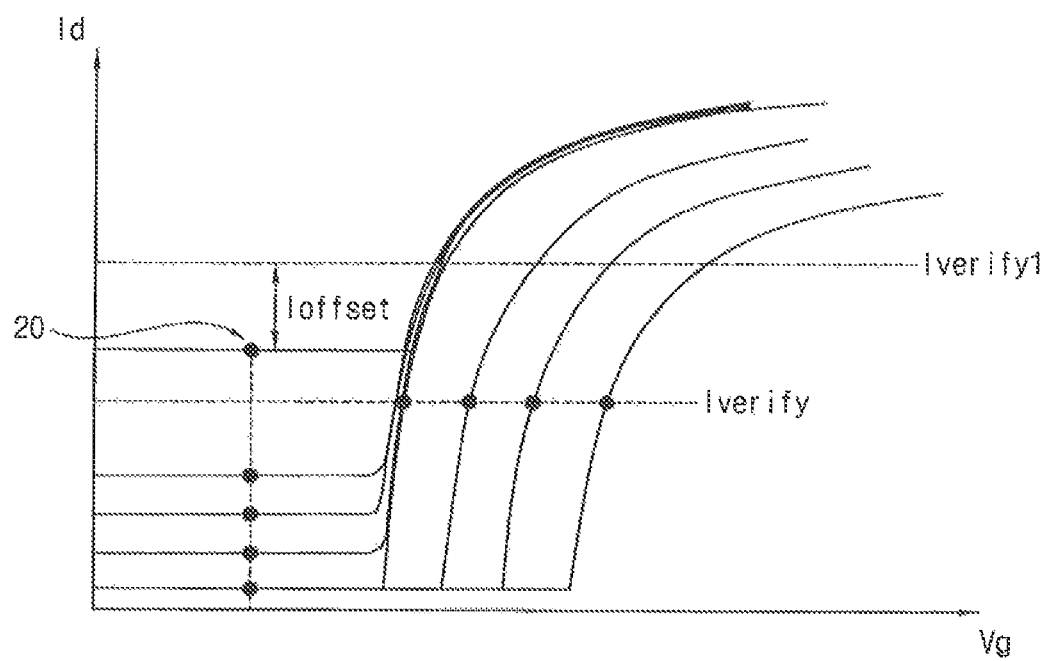
FIG. 4 shows a gate voltage-drain current in accordance with states in a memory cell according to an exemplary embodiment of the inventive concept.

FIG. 4 shows an example of a gate voltage-drain current in accordance with states in the memory cell described above.

Referring to FIG. 4, when the gate voltage Vg of the memory cell is lower than the lowest turn-on voltage of the cell transistor 2, the cell transistor may be turned off, and thus, levels of the resistances of the first data storage structure 120 may be distinguished. In the memory cell, the resistances of the first data storage structure 120 may be divided into a plurality of resistance levels.

The levels of the resistance of the first data storage structure 120 may be distinguished by a drain current. For example, as shown in FIG. 4, the drain current Id may have any one of four states. Therefore, the levels of the resistance of the first data storage structure 120 may be divided into four states.

When the gate voltage Vg is higher than the lowest turn-on voltage of the cell transistor 2 in the memory cell, the cell transistor 2 may be turned off or turned on depending on a charge storage state of the cell transistor 2. In other words, the threshold voltage of the cell transistor 2 in the memory cell may be divided into a plurality of threshold voltage levels.

The threshold voltage of the cell transistor 2 may be distinguished by a voltage having a specific drain current value Iverify. For example, as shown in FIG. 4, the threshold voltage may have any one of four levels. Therefore, the levels of the threshold voltage of the second data storage structure 116 may be divided into four levels.

As described above, the one memory cell may include two data storage units in which data are stored by different mechanisms. Thus, more data may be stored in the one memory cell. In addition, the number of data states required for the number of stored data in the one memory cell may be reduced.

Write of Data

Hereinafter, a method of storing (or writing) data in the memory cell of the vertical semiconductor device in accordance with exemplary embodiments of the inventive concept may be described.

Figure 5:
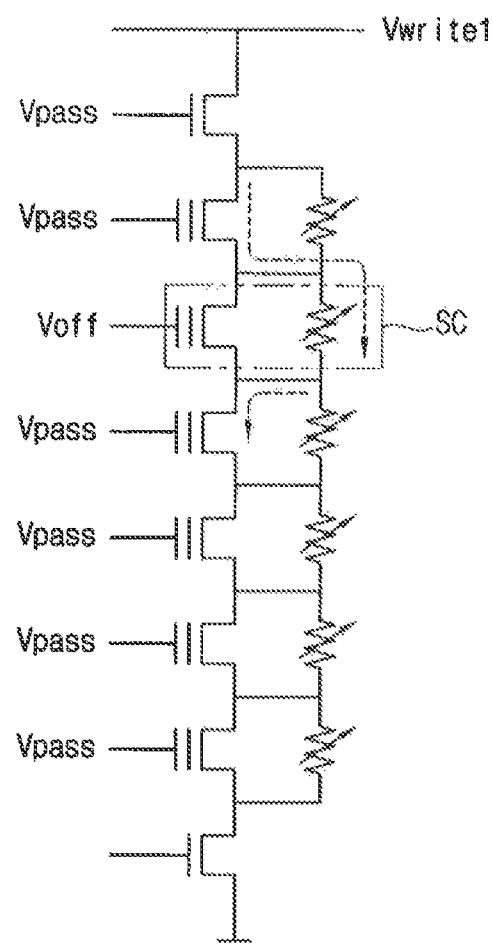
FIGS. 5 and 6 are circuit diagrams illustrating a method of storing data in a memory cell of a vertical semiconductor device in accordance with an exemplary embodiment of the inventive concept, respectively.
Figure 6:
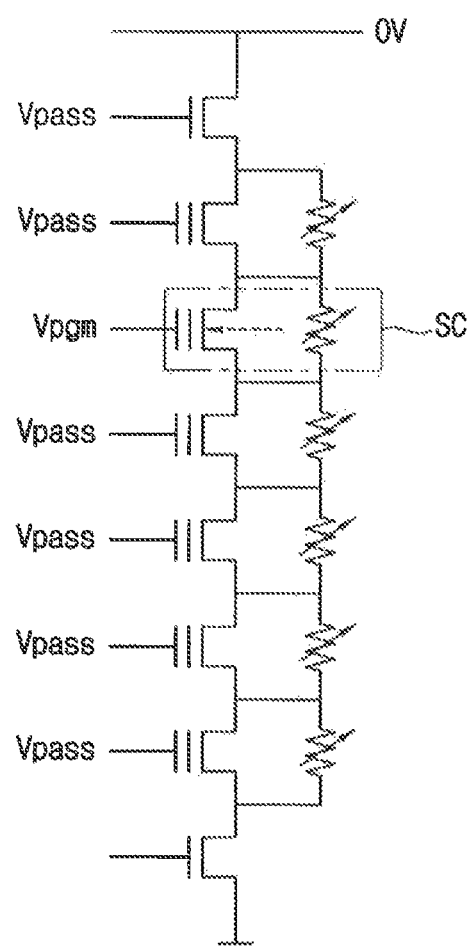

FIGS. 5 and 6 are circuit diagrams illustrating a method of storing data in the memory cell of the vertical semiconductor device in accordance with exemplary embodiments of the inventive concept.

Referring to FIG. 5, a method of storing data in the first data storage structure 120 of a selected memory cell SC may be described. The conditions in FIG. 5 are as follows:

Selected gate pattern: apply turn-off voltage (Voff)
Unselected gate pattern: apply pass voltage (Vpass)
Bit line of the selected memory cell SC: apply write pulse (Vwrite1) for the first data storage structure 120.

When the pass voltage Vpass is applied to unselected gate patterns to turn on of all of unselected gate patterns, currents may flow through the channel of the unselected cell transistors. At this time, currents may barely flow through the first data storage structures 120 of the un-selected memory cells.

The pass voltage Vpass may be a voltage higher than a threshold voltage (e.g., a maximum threshold voltage) in the cell transistor of a data programmed state.

Further, when the turn-off voltage Voff is applied to the selected gate pattern, the currents may not flow through the selected cell transistor. The turn-off voltage Voff may be a voltage lower than a threshold voltage (e.g., a minimum threshold voltage) in the cell transistor of a data erase state.

Thus, the write pulse may only be applied to the first data storage structure 120 of the selected memory cell SC through the bit line. Thus, data may be written in the first data storage structure 120 of the selected memory cell SC.

In exemplary embodiments of the inventive concept, the resistance of the first data storage structure 120 may have one of at least two states or two levels in accordance with the write pulse.

For example, the resistance of the first data storage structure 120 may have one of two states (e.g., a resistance state 0 or a resistance state 1). Thus, data of one bit may be stored in the first data storage structure 120 of the one memory cell.

In the alternative, the resistance of the first data storage structure 120 may have one of four states. In this case, the resistance of the first data storage structure 120 may include one of a resistance state 1 (0, 0), a resistance state 2 (0,1), a resistance state 3 (1,0) and a resistance state 4 (1, 1). Thus, data of two bits may be stored in the first data storage structure 120 of the one memory cell.

As described above, the resistance of the first data storage structure 120 may have the plurality of states, and data of multi-bits may be stored in the first data storage structure 120.

Referring to FIG. 6, a method of programming (or writing) data in a second data storage structure 116 of a selected memory cell SC may be described.

The programming conditions in FIG. 6 are as follows:

Selected gate pattern: apply programming voltage (Vpgm),
Unselected gate pattern: apply pass voltage (Vpass)
Bit line of selected memory cell SC: apply 0V (GND)

When the programming voltage Vpgm is applied to the selected gate pattern, charges may be injected from the channel into the charge storage layer of the second data storage structure 116. Thus, a threshold voltage of the selected cell transistor may be changed, so that data may be written in the second data storage structure 116 of the selected memory cell SC.

A method of erasing data in a second data storage structure 116 of a memory cell may also be described.

Data erase conditions are as follows:
Selected gate pattern: apply 0V (GND),
Unselected gate pattern: apply 0V (GND)
Bit line of selected memory cell: floating
Substrate (channel): apply erase voltage (Vers)

When the erase voltage Vers is applied to the channel, charges in the charge storage layer may be discharged to the channel, and thus, data may be erased. Therefore, a threshold voltage of a selected cell transistor may be lowered.

In exemplary embodiments of the inventive concept, the threshold voltage of the selected cell transistor may have one of at least two states or two levels by programming or erasing operations.

For example, the threshold voltage of the selected cell transistor may have one of two states (e.g., a threshold voltage state 0 or a threshold voltage state 1). Thus, data of one bit may be stored in the second data storage structure 116 of the one memory cell.

For example, the threshold voltage of the selected cell transistor may have one of four states. In this case, the threshold voltage of the selected cell transistor may include one of a threshold voltage state 1 (0,0), a threshold voltage state 2 (0,1), a threshold voltage state 3 (1,0) and a threshold voltage state of 4 (1,1). Thus, data of two bits may be stored in the second data storage structure 116 of one memory cell.

Therefore, data of multi-bits may be stored in the second data storage structure 116.

As described above, the memory cell may store data in each of two data storage structures. In other words, the memory cell may have two data parameters for storing data. Thus, the number of states required for storing data of multi-bits in the one memory cell may be reduced.

FIGS. 7A, 7B, 8A, and 8B show the number of states for storing data of multi-bits in a memory cell, respectively.

Figure 7A:
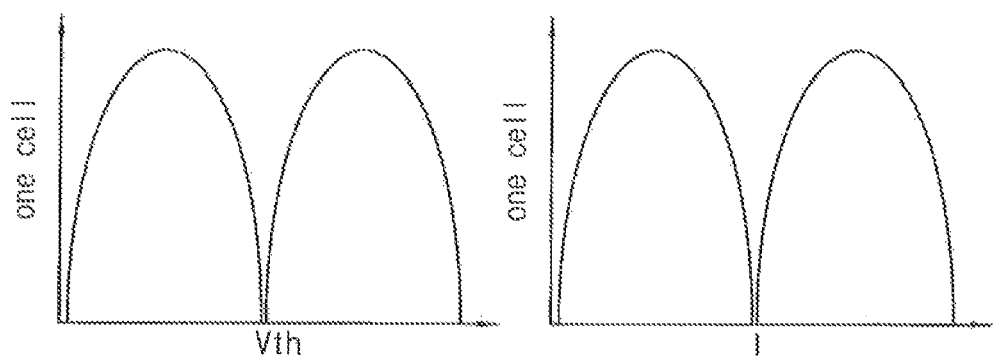
FIGS. 7A, 7B, 8A, and 8B show the number of states for storing data of multi-bits in a memory cell, respectively.
Figure 7B:
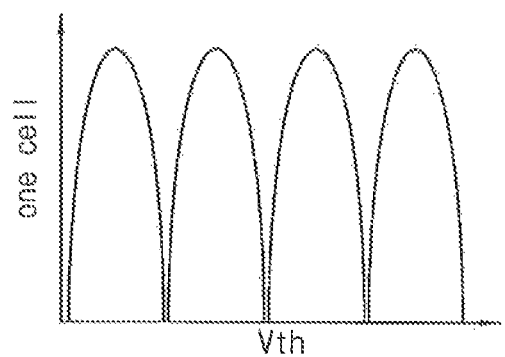
Figure 8A:
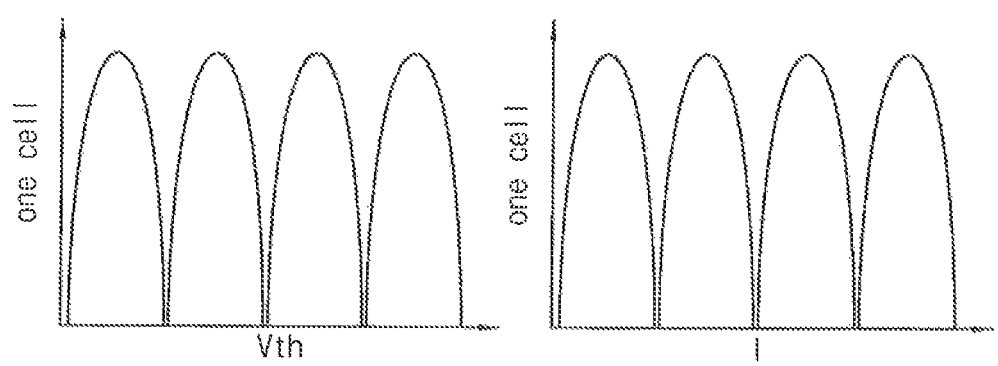
Figure 8B:
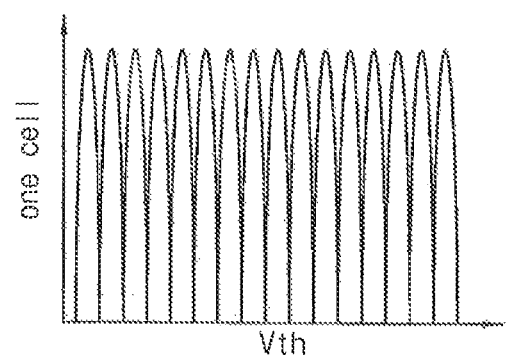

FIGS. 7A and 8A show the number of states for storing data of two bits and data of four bits, respectively, in the one memory cell having two data parameters in accordance with exemplary embodiments of the inventive concept. To compare with this, FIGS. 7B and 8B show the number of states for storing data of two bits and four bits, respectively, in one memory cell having one data parameter.

Referring to FIG. 7A, when data of one bit is stored in each of the first and second data storage structures 120 and 116, data of two bits may be stored in the one memory cell. In other words, the one memory cell may store one of two resistance states (I) in the first data storage structure 120 and one of two threshold voltage states (Vth) in the second data storage structure 116. In other words, the one memory cell may be divided into four states by combinations of the states of the first and second data storage structures 120 and 116, so that data of two bits may be stored in the one memory cell.

On the other hand, referring to FIG. 7B, when only one data storage structure is included in one memory cell, the data storage structure of the one memory cell may include four states to store data of two bits in the one memory cell.

Referring to FIG. 8A, when data of two bits are stored in each of the first and second data storage structures 120 and 116, data of four bits may be stored in the one memory cell. In other words, the one memory cell may store one of four resistance states (I) in the first data storage structure 120 and one of four threshold voltage states (Vth) in the second data storage structure 116. In other words, the data storage structure of the memory cell may include eight states. Therefore, the data may be stored in each of the first and second data storage structures 120 and 116, so that the one memory cell may be divided into sixteen states by combinations of the states of the first and second data storage structures 120 and 116. Thus, data of four bits may be stored in the one memory cell.

On the other hand, referring to FIG. 8B, when only one data storage structure is included in one memory cell, the data storage structure of the one memory cell may include sixteen states to store data of four bits data in the one memory cell.

In other words, when the one memory cell includes only one data storage structure, the one memory cell may require $2^n$ states to store data of n-bits in the one memory cell.

On the other hand, when one memory cell includes two data storage structure, the one memory cell may required $2^a+2^b$ (a+b=n) states to store data of n-bits in the one memory cell.

As described above, the data may be stored in each of the two data storage structures, and data may be combined with each other. Thus, the number of states required for a memory cell having multi-bits may be reduced. Therefore, the data stored in the one memory cell may be easily distinguished.

On the other hand, in a general case of one memory cell including only one data storage structure, as the number of data bits stored in one memory cell increases, the number of states to be distinguished in the data storage structure may significantly increase. Therefore, each of the states may not be separately stored and read in the one memory cell.

However, in exemplary embodiments of the inventive concept, as the number of data of bits stored in the one memory cell is increased, the number of required states in the one memory cell may be significantly reduced, compared with the case of the memory cell including the one data storage structure. For example, when data of six bits are stored in the one memory cell, sixteen states may be required in the one memory cell in accordance with exemplary embodiments of the inventive concept. However, in the case of the memory cell including the one data storage structure, 64 states may be required for storing data of six bits in the memory cell. Thus, each of the states may be easily stored and read in the memory cell in accordance with exemplary embodiments of the inventive concept.

Read of Data

Hereinafter, a method of reading data of the memory cell in the vertical semiconductor device in accordance with exemplary embodiments of the inventive concept may be described.

FIGS. 9 to 12 are views for explaining a method of reading data of the memory cell in the vertical semiconductor device.

Figure 9:
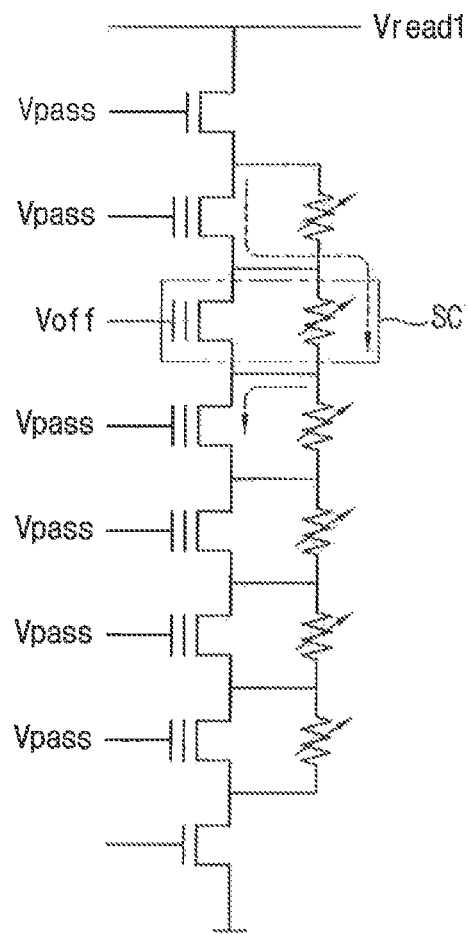
FIGS. 9, 10, 11 and 12 are views for explaining a method of reading data of a memory cell in a vertical semiconductor device according to an exemplary embodiment of the inventive concept.

Referring to FIG. 9, a method of reading data of the first data storage 120 structure of a selected memory cell SC may be described. The conditions of FIG. 9 are as follows:
Selected gate pattern: apply turn-off voltage (Voff)
Unselected gate pattern: apply pass voltage (Vpass)
Bit line of selected memory cell SC: apply first read voltage (Vread1)

When a pass voltage Vpass is applied to turn on of all the unselected gate patterns, currents can flow through the channel of the unselected cell transistors. At this time, the currents may barely flow through the first data storage structure 120 of the unselected memory cell.

Further, when the turn-off voltage Voff is applied to the selected gate pattern, the currents may not flow through the selected cell transistor. Thus, the currents may flow through the first data storage structure 120 depending on the resistance of the first data storage structure 120 of the selected memory cell SC.

Therefore, a current level may be changed as the resistance of the first data storage structure 120 changes. Thus, data stored in the first data storage structure 120 of the selected memory cell SC may be read by comparing the current level and a verifying current level.

In exemplary embodiments of the inventive concept, when data of one bit is stored in the first data storage structure 120, two resistance states (e.g., resistance state 0 or resistance state 1) of the first data storage structure 120 may be distinguished by one verifying current level. The one verifying current level may be referred to as a first verifying current level.

Figure 10:
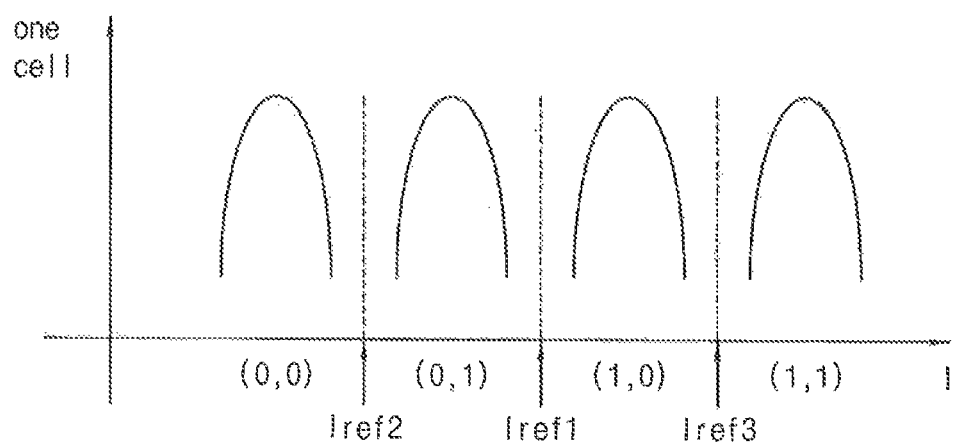

FIG. 10 shows a distribution of current levels when data of two bits are stored in the first data storage structure 120.

Referring to FIG. 10, when data of two bits are stored in the first data storage structure 120, one of four read current states may exist depending on the resistance of the first data storage structure 120. Thus, four resistance states of the first data storage structure 120, for example, the resistance state 1 (0,0), the resistance state 2 (0,1), the resistance state 3 (1,0), and the resistance state 4 (1,1), may be distinguished by three verifying current levels, in other words, Iref1, Iref2 and Iref3.

Figure 11:
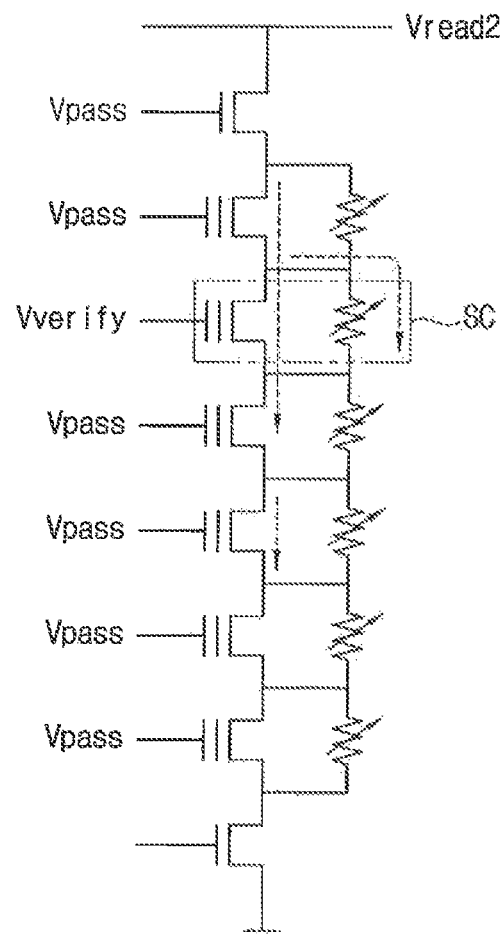

Referring to FIG. 11, a method of reading data of a second data storage structure 116 of a selected memory cell SC may be described. The conditions of FIG. 11 are as follows:

Selected gate pattern: apply read verifying voltage (Vverify)

Unselected gate pattern: apply pass voltage (Vpass)

Bit line of the selected memory cell SC: apply second read voltage (Vread2)

When a pass voltage Vpass is applied to turn on of all the unselected gate patterns, currents may flow through the channel of the unselected cell transistors. At this time, the currents may barely flow through the first data storage structures 120 of the unselected memory cells.

Further, when the read verifying voltage Vverify is applied to the selected gate pattern, the selected cell transistor may be turned on or turned off according to the data written in the selected cell transistor. Therefore, the currents may flow or not flow through the selected cell transistor according to a threshold voltage of the selected cell transistor.

Therefore, when the read verifying voltage Vverify is applied to the selected gate pattern, a current level flowing through the selected cell transistor may be changed by the turn-on or turn-off of the selected transistor according to the data written in the second data storage structure 116. The threshold voltage of selected cell transistor may be distinguished by the current level. Thus, the data stored in the second data storage structure 116 may be read.

At this time, even if the selected transistor is turned off, the currents may slightly flow through the first data storage structure 120 depending on the resistance of the first data storage structure 120 of the selected memory cell SC. Therefore, a verifying current value (e.g., Iverify in FIG. 4) for determining the state of the selected cell transistor may be set to a higher current value than the current flowing through the first data storage structure 120 having a low resistance state in the selected memory cell SC.

In exemplary embodiments of the inventive concept, when data of one bit is stored in the second data storage structure 116, two threshold voltage states (e.g., threshold voltage state 0 or threshold voltage state 1) of the second data storage structure 116 may be distinguished by applying one read verifying voltage.

Figure 12:
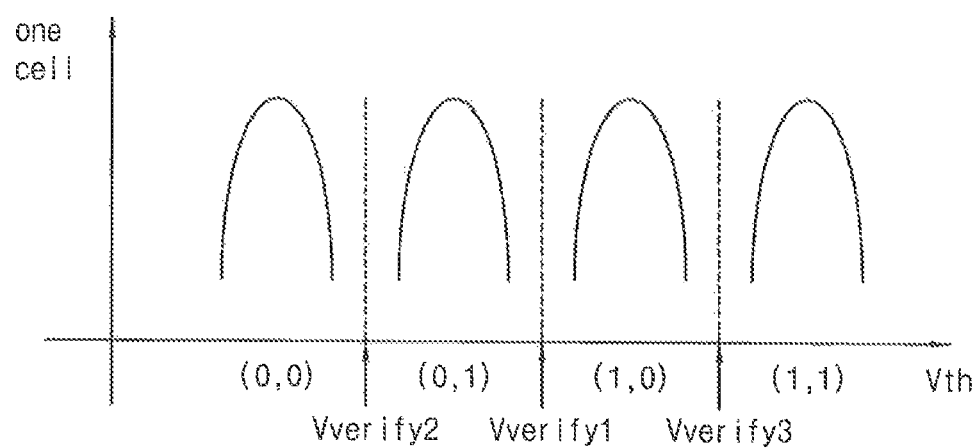

FIG. 12 shows a distribution of threshold voltages when data of two bits are stored in the second data storage structure 116.

Referring to FIG. 12, when data of two bits are stored in the second data storage structure 116, the second data storage structure 116 may have one of four threshold voltage states. In other words, the four threshold voltage states of the second data storage structure 116, for example, the threshold voltage state 1 (0,0), the threshold voltage state 2 (0,1), the threshold voltage state 3 (1,0), and the threshold voltage state 4 (1,1) may be distinguished by applying three read verifying voltages, e.g., Vverify1, Vverify2, and Vverify3.

As described above, one memory cell may include two data storage units in which data are stored by different mechanisms. The data stored in each of the data storage units may be separately read. In addition, the number of data states required for the number of data stored in the one memory cell may be reduced; therefore, the data may be correctly and easily read.

Data Write and Read Sequence

An example of a sequence for writing data of the memory cells may be described hereinafter. However, the sequence for writing data of the memory cells may not be limited thereto.

In exemplary embodiments of the inventive concept, first, data may be written in the second data storage structures 116 including a charge storage layer 112. Thereafter, data may be written in the first data storage structures 120 including the variable resistance material.

In exemplary embodiments of the inventive concept, first, data may be written in the first data storage structures 120 including the variable resistance material. Thereafter, data may be written in the second data storage structures 116 including the charge storage layer 112.

In exemplary embodiments of the inventive concept, data may be stored sequentially in the first and second data storage structures 120 and 116 of a selected memory cell SC, respectively. For example, data may be written in the first data storage structure 120 including the variable resistance material of the selected memory cell SC, and then, data may be written to the second data storage structure 116 including the charge storage layer 112 of the selected memory cell SC. For example, data may be written in the second data storage structure 116 of the selected memory cell SC, and then, data may be written to the first data storage structure 120 of the selected memory cell SC.

An example of a sequence for reading data stored in the memory cells may be described hereinafter. However, the sequence of the reading data stored in the memory cell may not be limited thereto.

In exemplary embodiments of the inventive concept, first, the data of the second data storage structures 116 may be read. Thereafter, data of the first data storage structures 120 including the variable resistance material may be read.

In exemplary embodiments of the inventive concept, first, the data of the first data storage structures 120 may be read. Thereafter, the data of the second data storage structures 116 may be read.

In exemplary embodiments of the inventive concept, first, data of the first data storage structure 120 of a selected memory cell SC may be read. Thereafter, data of the second data storage structure 116 of the selected memory cell SC may be read. In this case, a verifying current value (e.g., Iverify in FIG. 4) for determining the state of the second data storage structure 116 may be set to a higher current value than the current flowing through the first data storage structure 120 having a low resistance state in the selected memory cell SC.

However, the currents flowing through the first data storage structure 120 may be abnormally high, and in this case, the currents may be higher than the verifying current Iverify (20, refer to FIG. 4). If the current value flowing through the first data storage structure 120 is higher than the verifying current Iverify, the verifying current Iverify may be increased. In other words, the verifying current Iverify may be reset to a value obtained by adding the current flowing through the first data storage structure 120 and a fixed offset current (Ioffset in FIG. 4). Therefore, the reset verifying current (Iverify1) may be higher than the original verifying current Iverify.

FIGS. 13 to 16 are cross-sectional views illustrating stages of a method of manufacturing a vertical semiconductor device in accordance with exemplary embodiments of the inventive concept.

Figure 13:
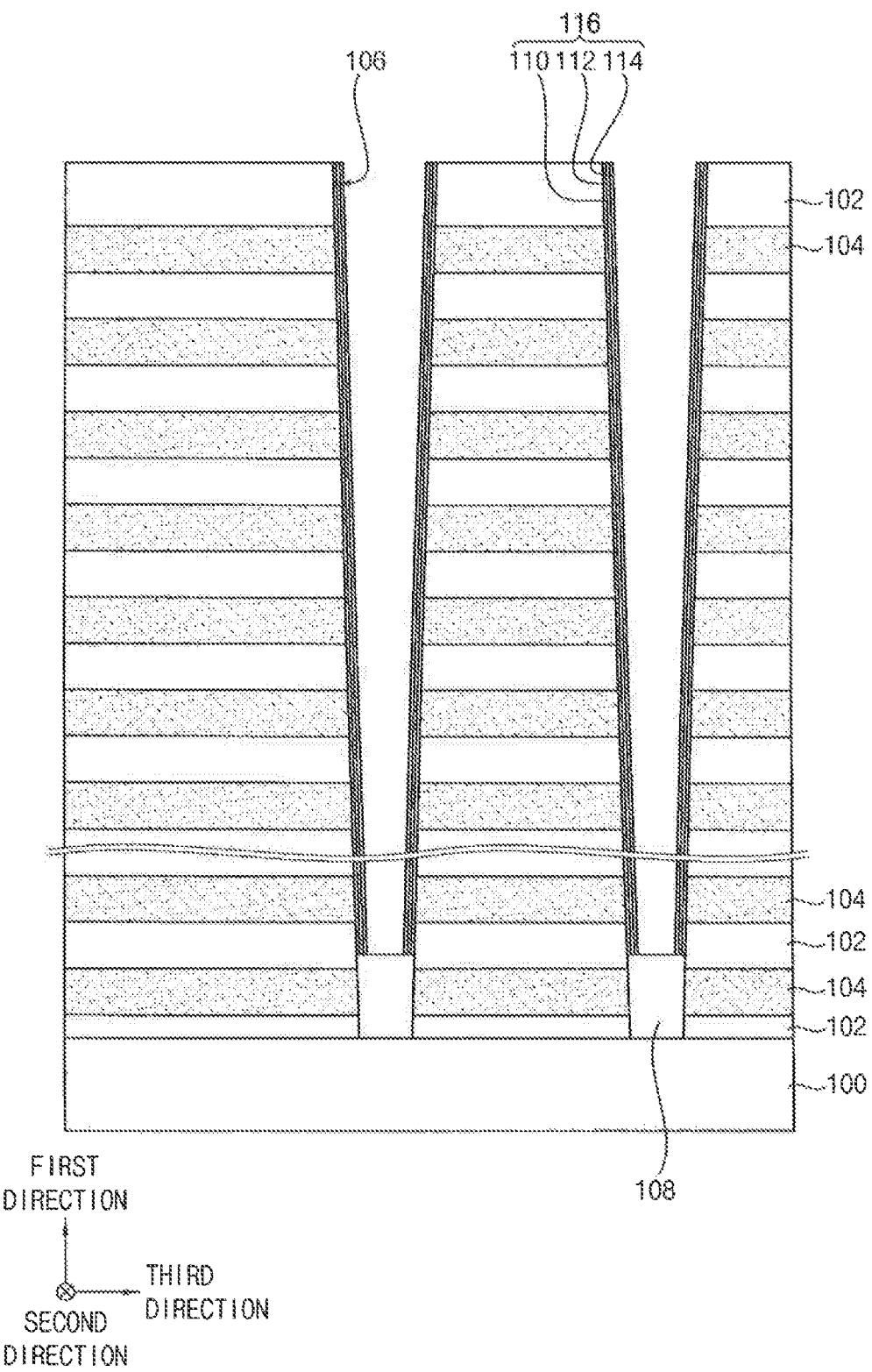
FIGS. 13, 14, 15 and 16 are cross-sectional views illustrating stages of a method of manufacturing a vertical semiconductor device in accordance with an exemplary embodiment of the inventive concept.

Referring to FIG. 13, insulation layers 102 and first sacrificial layers 104 may be alternately and repeatedly stacked on a substrate 100 to form a first mold layer. An upper surface of the first mold layer may expose the insulation layer 102.

In exemplary embodiments of the inventive concept, the insulation layers 102 may include an oxide such as silicon oxide. The first sacrificial layers 104 may include a nitride, such as silicon nitride.

A plurality of channel holes 106 may be formed through the first mold layer to expose a surface of the substrate 100.

In exemplary embodiments of the inventive concept, a semiconductor pattern 108 may be further formed on a bottom surface of the channel holes 106, and the semiconductor pattern 108 may contact the substrate 100.

The blocking layer 110, the charge storage layer 112, and the tunnel insulation layer 114 may be sequentially formed on the upper surface of the first mold layer, a sidewall of the channel hole 106, and an upper surface of the semiconductor pattern 108. The blocking layer 110, the charge storage layer 112, and the tunnel insulation layer 114 formed on the upper surfaces of the first mold layer and the semiconductor pattern 108 may be removed by anisotropic etching process. Therefore, the blocking layer 110, the charge storage layer 112, and the tunnel insulation layer 114 may be sequentially stacked on the sidewall of the channel hole 106. The blocking layer 110, the charge storage layer 112 and the tunnel insulation layer 114 may serve as a second data storage structure 116.

Figure 14:
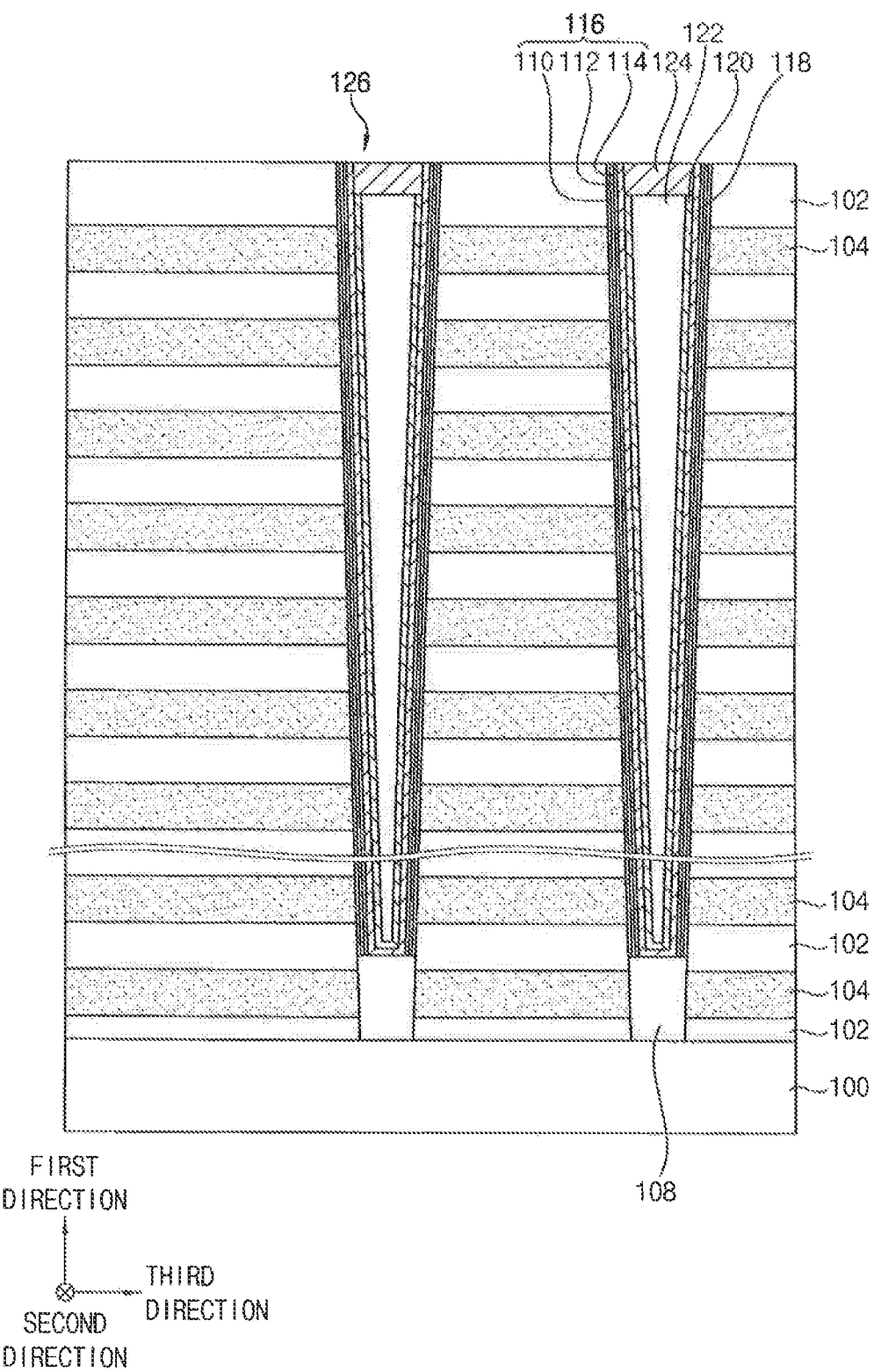

Referring to FIG. 14, a channel layer may be formed conformally on the tunnel insulation layer 114, the semiconductor pattern 108, and the first mold layer. A variable resistance layer is formed on the channel layer. Thereafter, a filling insulation layer is formed on the variable resistance layer to fill the channel hole 106.

The filling insulation layer, the variable resistance layer, and the channel layer may be planarized until the upper surface of the first mold layer is exposed. Upper portions of the variable resistance layer and the filling insulation layer may be partially removed to form an upper recess exposing an upper sidewall of the channel layer. An upper conductive pattern 124 may be formed to fill the upper recess.

Thus, a vertical structure 126 including a second data storage structure 116, a channel 118, a first data storage structure 120, a filling insulation pattern 122 and the upper conductive pattern 124 may be formed to fill the channel hole 106.

The channel 118 may be formed on the tunnel insulation layer 114 and the semiconductor pattern 108, and may have a cylindrical shape. The channel 118 may be electrically connected to the substrate 100. The channel 118 may be disposed between the first data storage structure 120 and the second data storage structure 116. The channel 118 may include, e.g., polysilicon.

The variable resistance layer formed on the channel 118 may include, e.g., a cylindrical shape. The variable resistive layer may serve as the first data storage structure 120.

The filling insulation pattern 122 may be formed on the variable resistance layer, and may fill most of the channel holes 106. The upper conductive pattern 124 may contact an upper portion of the channel 118. The upper conductive pattern 124 may include, e.g., polysilicon.

Figure 15:
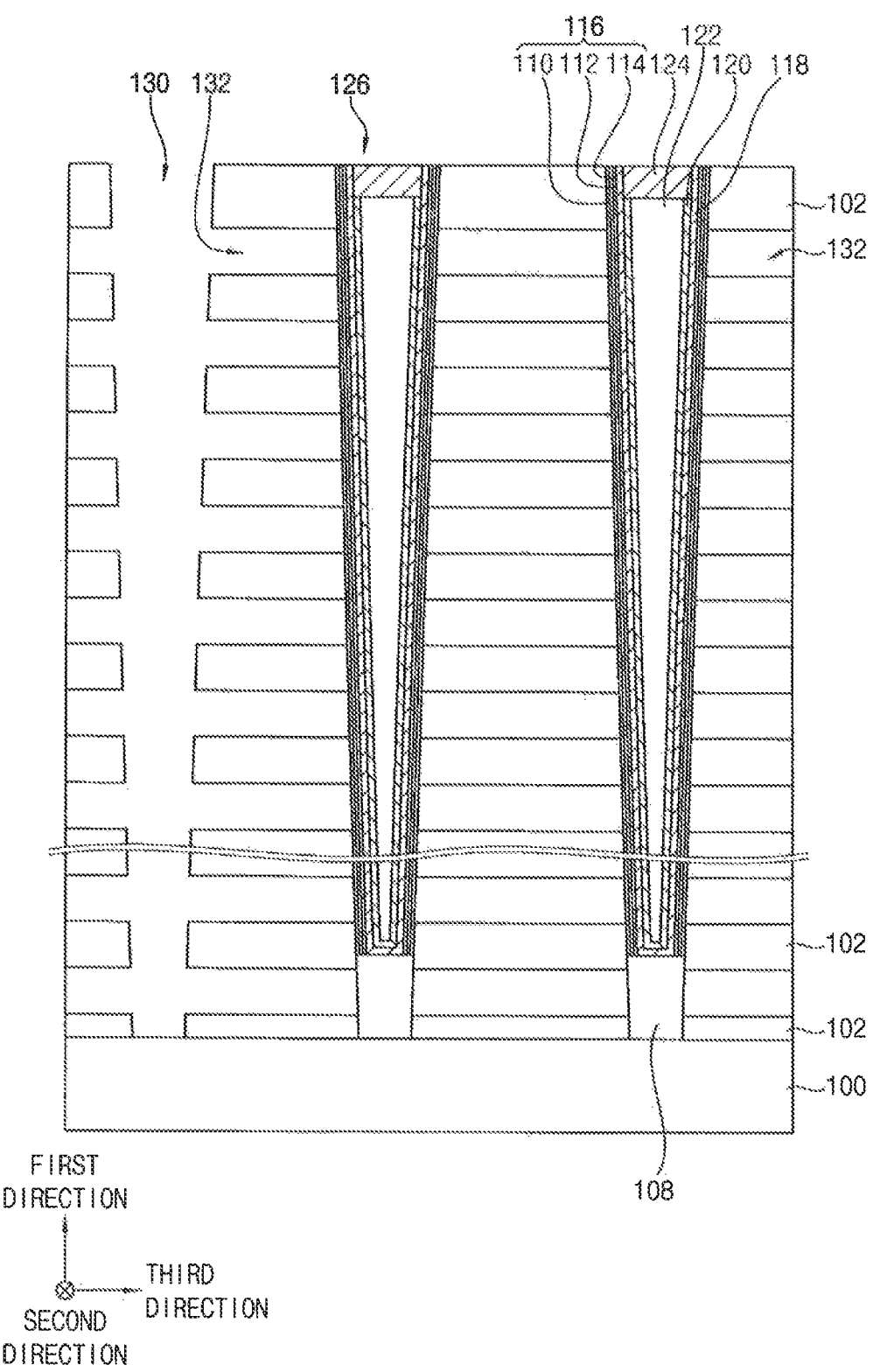

Referring to FIG. 15, a first trench 130 may be formed through the first mold layer by an anisotropic etching process. An upper surface of the substrate 100 may be exposed by the first trench 130. The first trench 130 may extend in the second direction. A mold structure extending in the second direction may be formed by forming the first trench 130.

The first sacrificial layers 104 exposed by a sidewall of the first trench 130 may be removed to form first gaps 132 between the insulation layers 102. A portion of the outer wall of the vertical structures 126 may be exposed by the first gap 132. In other words, a portion of the blocking layer 110 and a sidewall of the semiconductor pattern 108 may be exposed by the first gap 132.

Figure 16:
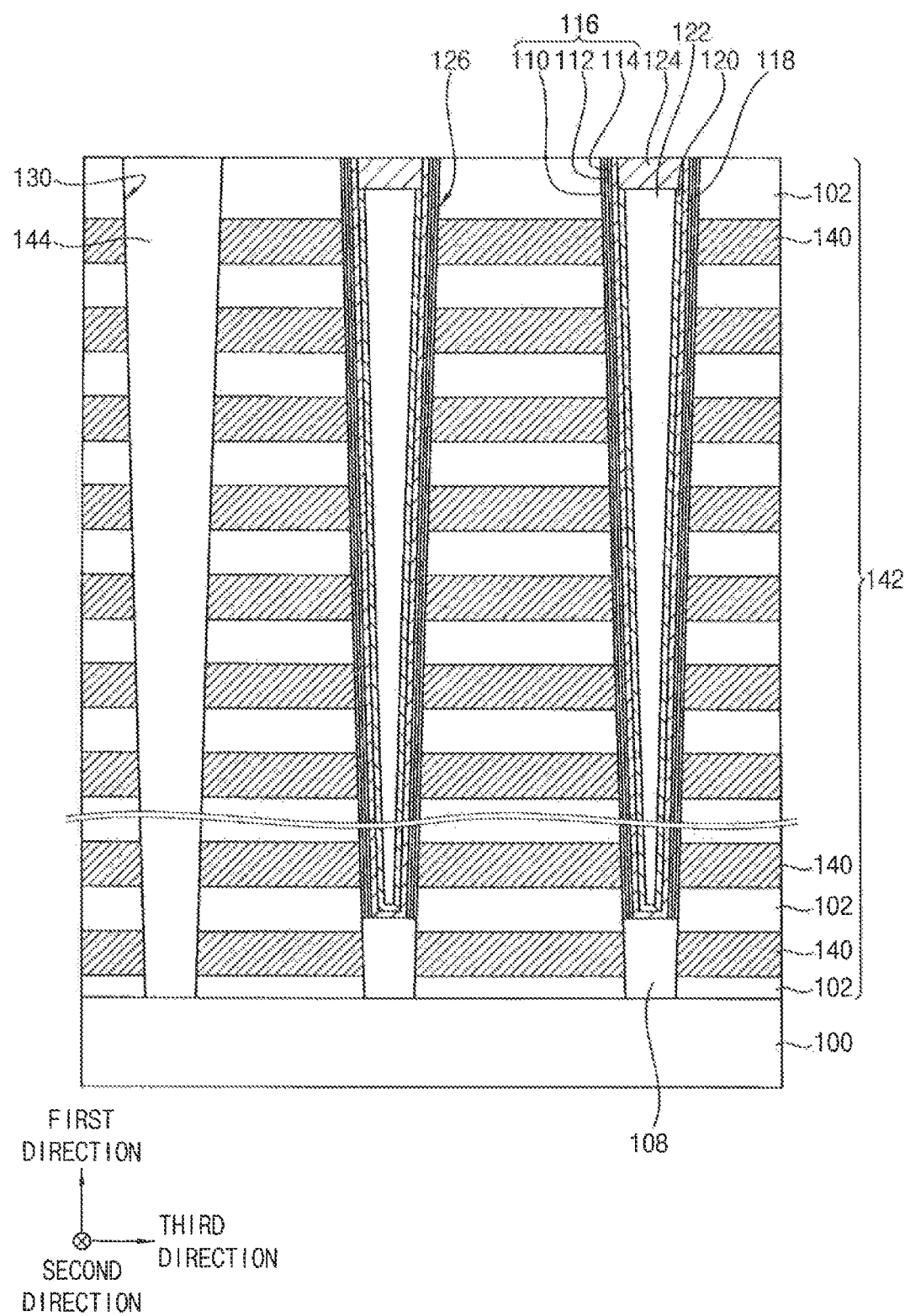

Referring to FIG. 16, a gate electrode layer may be formed to fill at least the first gap 132, and the gate electrode layer formed in the first trench 130 may be removed to form a gate pattern 140 in the first gap 132.

In exemplary embodiments of the inventive concept, before forming the gate electrode layer, a second blocking layer may be formed on a surface of the first gap 132.

In exemplary embodiments of the inventive concept, the gate pattern 140 may include a barrier layer and a gate conductive layer sequentially stacked. The gate conductive layer may include a metal having low electrical resistance such as tungsten, titanium, tantalum, and platinum, and the barrier layer may include a metal nitride such as tungsten nitride, titanium nitride, and tantalum nitride.

Thereafter, an insulation pattern 144 may be formed in the first trench 130.

In exemplary embodiments of the inventive concept, an insulation spacer may be formed on the sidewall of the first trench 130, and a common source line may be formed in the first trench 130 to contact the substrate 100.

By performing the above processes, a stacked structure 142 including the insulation layers 102 and the gate patterns 140 alternately and repeatedly stacked may be formed on the substrate 100.

Referring again to FIG. 1, an upper insulation layer 150 may be formed on the stacked structure 142 and the insulation pattern 144. A bit line contact 152 may be formed through the upper insulation layer 150, and may be electrically connected to the upper conductive pattern 124. In addition, bit lines 154 extending in the second direction may be formed on the upper insulation layer 150 and the bit line contacts 152. Thus, a bit line structure 156 including the bit line contact 152 and the bit line 154 may be formed.

As described above, the variable resistance layer is formed on the inner sidewall of the channel 118; therefore, the vertical semiconductor device having memory cells including the first and second data storage 120 and 116 structures may be manufactured.

The vertical semiconductor device in accordance with exemplary embodiments of the inventive concept may include two data storage units in the one memory cell. However, a structure of the memory cell and a shape of the memory cell may be variously modified.

Figure 17:
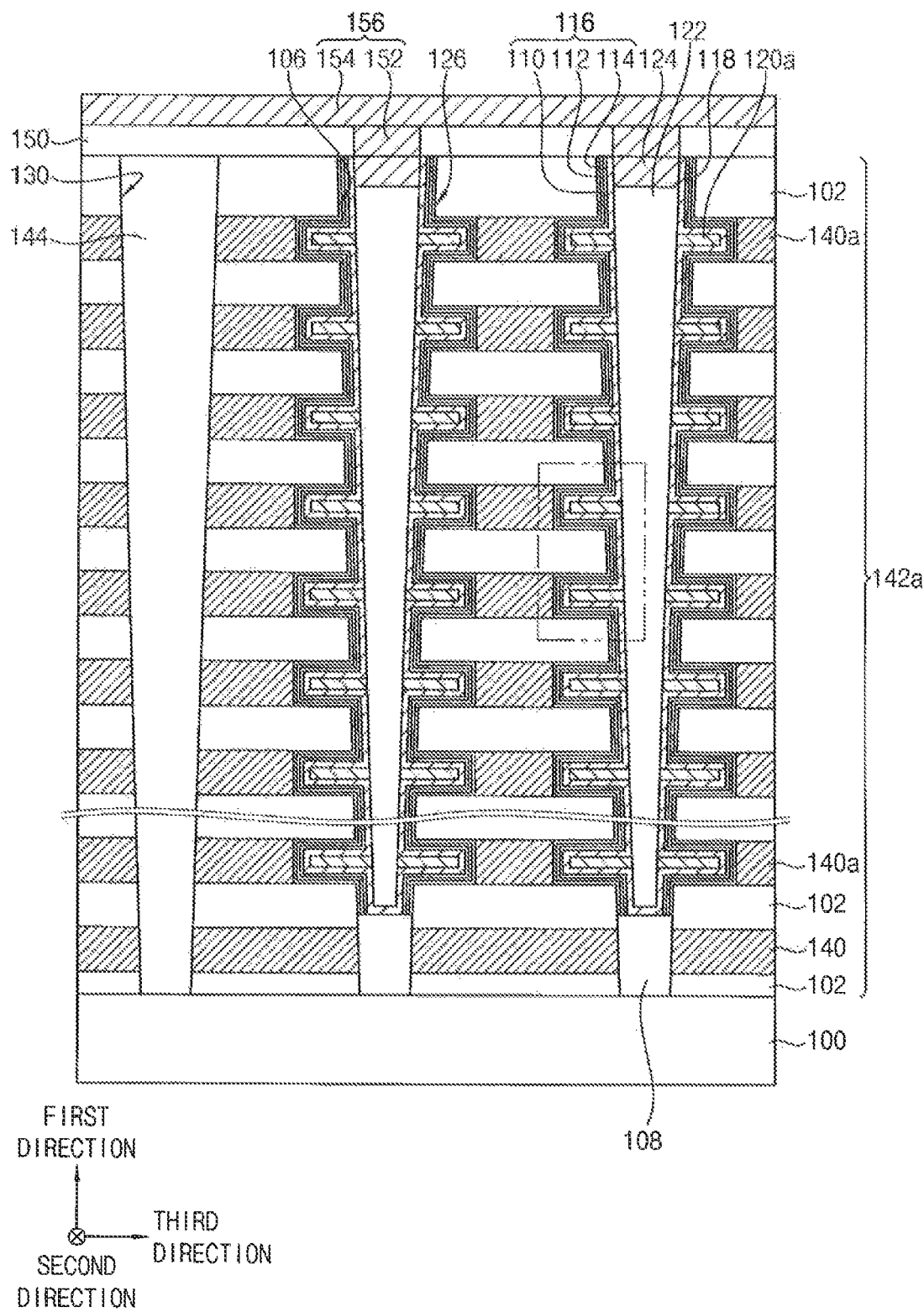
FIG. 17 is a cross-sectional view illustrating a vertical semiconductor device in accordance with an exemplary embodiment of the inventive concept.
Figure 18:
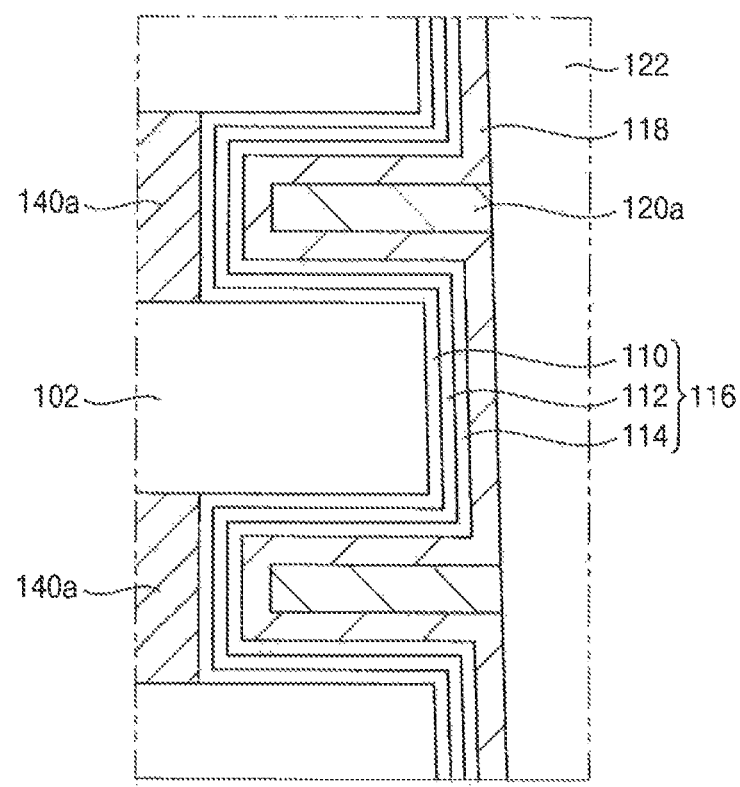
FIG. 18 is an enlarged cross-sectional view of a memory cell of a vertical semiconductor device in accordance with an exemplary embodiment of the inventive concept.
Figure 19:
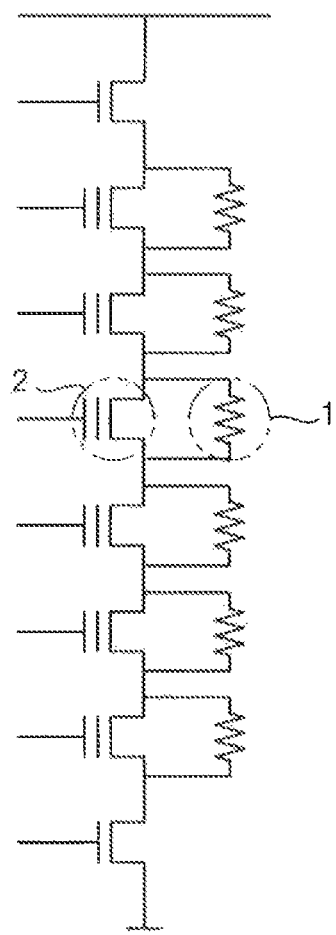
FIG. 19 is a circuit diagram of memory cells of a vertical semiconductor device in accordance with an exemplary embodiment of the inventive concept.

FIG. 17 is a cross-sectional view illustrating a vertical semiconductor device in accordance with an exemplary embodiment of the inventive concept. FIG. 18 is an enlarged cross-sectional view of a memory cell of a vertical semiconductor device in accordance with an exemplary embodiment of the inventive concept. FIG. 19 is a circuit diagram of memory cells of a vertical semiconductor device in accordance with an exemplary embodiment of the inventive concept.

Referring to FIGS. 17 to 19, the vertical semiconductor device may include the stacked structure 142a formed on the substrate 100 and the vertical structures 126 including the channel 118 and passing through the stacked structure 142a.

The stacked structure 142a may include the insulation layers 102 and the gate patterns 140a alternately and repeatedly stacked.

The vertical structure 126 may include the second data storage structure 116, the channel 118, the first data storage structure 120a, the filling insulation pattern 122, and an upper conductive pattern 124 sequentially stacked on the gate pattern 140a in a direction parallel to the surface of the substrate 100.

The first data storage structure 120a may face the gate pattern 140a, and may have an isolated shape. For example, the first data storage structure 120a may protrude toward the gate pattern 140a along the third direction. The first data storage structures 120a included in the memory cells of a cell string may be spaced apart from each other in the first direction. In addition, the second data storage structure 116 included in the memory cells of the cell string may extend in the first direction, and the channel 118 may extend in the first direction.

In exemplary embodiments of the inventive concept, a recess (107, refer to FIG. 20) may be disposed at an area from the sidewall of the channel hole 106 to the sidewall of gate pattern 140a. In other words, the recess 107 may be open through the sidewall of the channel hole 106, and the recesses 107 may be repeatedly arranged to be spaced apart from each other in the first direction.

The vertical structure 126 may be formed in the channel hole 106 and the recess 107.

In exemplary embodiments of the inventive concept, the second data storage structure 116 may be conformally formed on the sidewall of the channel hole 106 and the surface of the recess 107. The channel 118 may be conformally formed on the surface of the channel hole 106 and in the recess 107. Thus, the channel 118 may be electrically connected to the substrate 100.

The first data storage structure 120a may be formed in the recess 107, and may contact the channel 118. Thus, the first data storage structures 120a may be formed on the channel 118, and the first data storage structures 120a may be spaced from each other in the first direction.

In exemplary embodiments of the inventive concept, the gate pattern 140 formed on the sidewall of the semiconductor pattern 108 may have the same as a shape of that as shown in FIG. 1.

Each memory cell included in the cell string may have a circuit diagram as shown in FIG. 19. Referring to FIG. 19, the first data storage structures (e.g., variable resistance layers) of memory cells may be physically spaced apart from each other. An electrical operation of the circuit diagram of FIG. 19 may be substantially the same as an electrical operation of the circuit diagram as shown in FIG. 3.

Therefore, the vertical semiconductor device may be performed a write operation and read operation in substantially the same as manner as described with reference to FIGS. 5 to 12. The vertical semiconductor device may store data of multi-bits in each of the first and second data storage structures 120a and 116 of the one memory cell.

Figure 20:
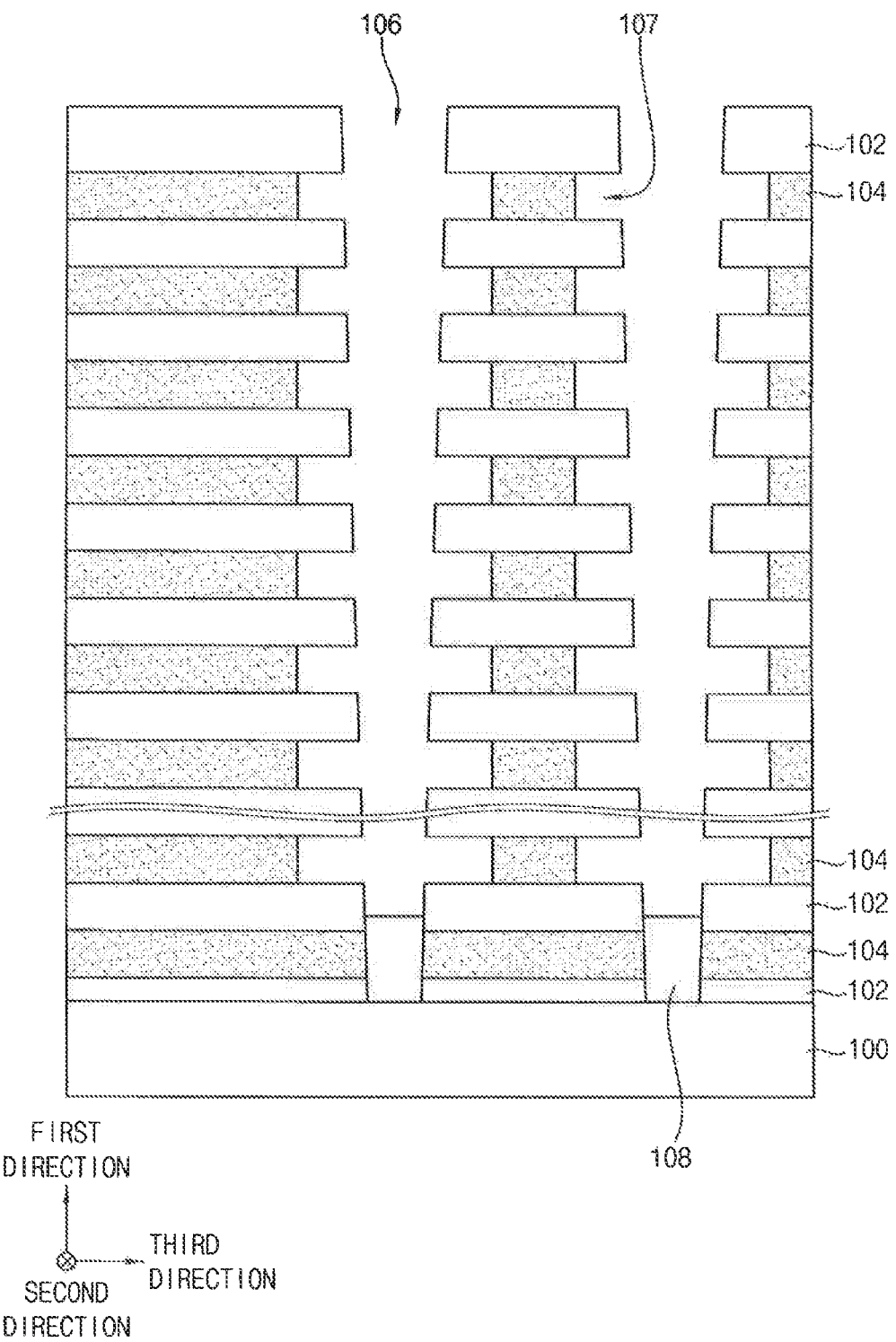
FIGS. 20, 21 and 22 are cross-sectional views illustrating stages of a method of manufacturing a vertical semiconductor device according to an exemplary embodiment of the inventive concept.
Figure 21:
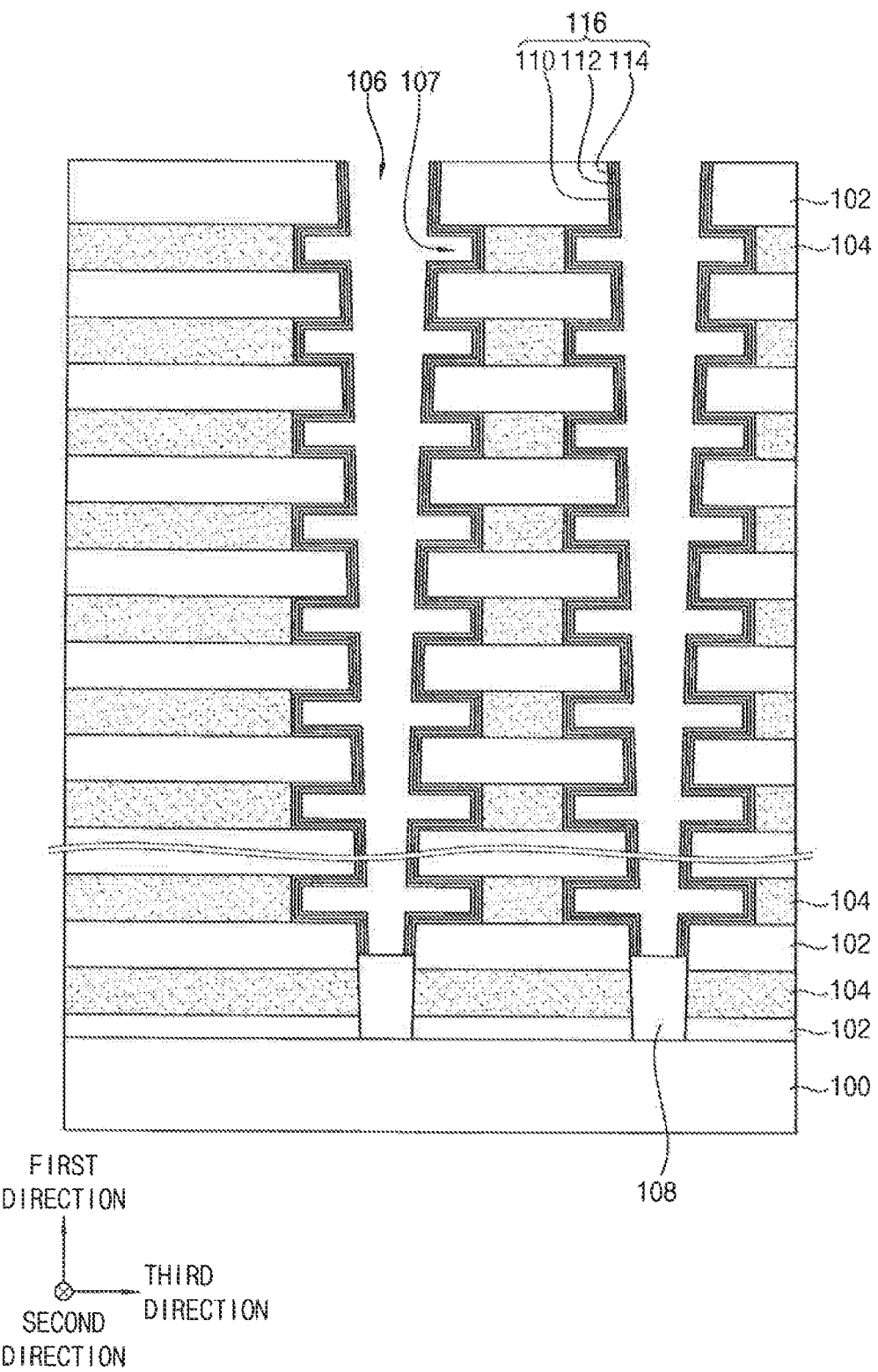
Figure 22:
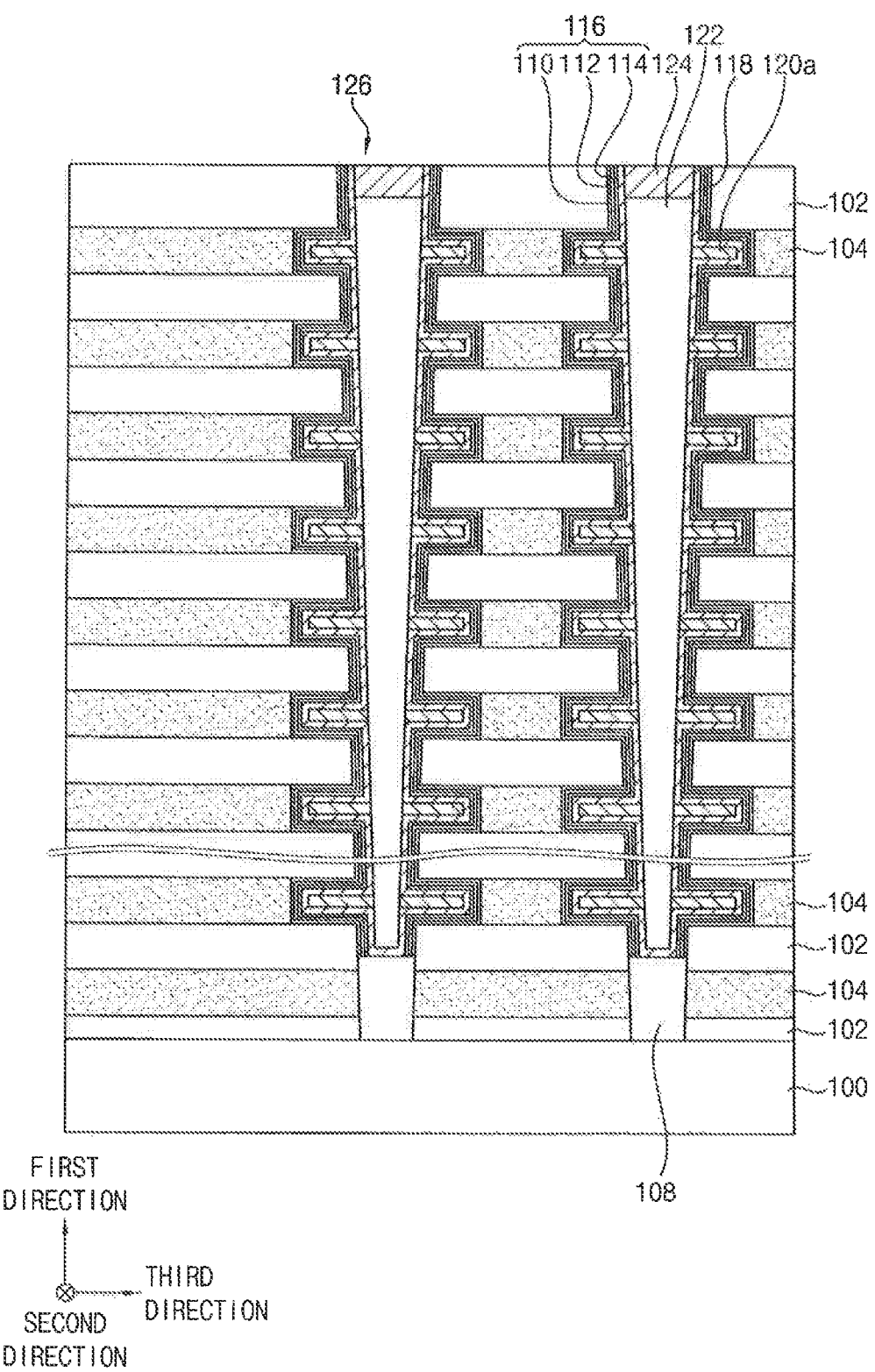

FIGS. 20 to 22 are cross-sectional views illustrating stages of a method of manufacturing a vertical semiconductor device according to an exemplary embodiment of the inventive concept.

Referring to FIG. 20, the insulation layers 102 and the first sacrificial layers 104 may be alternately and repeatedly formed on the substrate 100 to form the first mold layer. The channel holes 106 may be formed through the first mold layer to expose the surface of the substrate 100. In exemplary embodiments of the inventive concept, the semiconductor pattern 108 may be formed on the bottom surface of the channel holes 106, and the semiconductor pattern 108 may contact the substrate 100.

Thereafter, a portion of the first sacrificial layers 104 exposed by the sidewall of the channel hole 106 may be etched to form the recess 107.

Referring to FIG. 21, the blocking layer 110, the charge storage layer 112, and the insulation layer 114 may be sequentially formed on the upper surface of the first mold layer, the sidewall of the channel hole 106, the upper surface of the semiconductor pattern 108. The blocking layer 110, the charge storage layer 112, and the tunnel insulation layer 114 formed on the upper surfaces of the first mold layer and the semiconductor pattern 108 may be anisotropically etched. Thus, the blocking layer 110, the charge storage layer 112, and the tunnel insulation layer 114 may be sequentially and conformally formed on the sidewall of the channel hole 106 and the surface of the recess 107. The blocking layer 110, the charge storage layer 112, and the tunnel insulation layer 114 may serve as the second data storage structure 116.

Referring to FIG. 22, the channel layer may be formed conformally on the tunnel insulation layer 114 and the first mold layer. The variable resistance layer may be formed on the channel layer. The channel layer may not completely fill the recess 107. The variable resistive layer may completely fill the recess 107.

A portion of the variable resistive layer may be etched so that the variable resistive layer may only remain in the recess 107. Thus, a variable resistance pattern may be formed in the recess 107, and a plurality of the variable resistance patterns may be spaced apart from each other in the first direction. Each of the variable resistance patterns may serve as the first data storage structure 120a.

Thereafter, a filling insulation layer may be formed on first data storage structure 120a and the channel layer to fill a remaining portion of the channel hole 106. Thereafter, the filling insulation layer and the channel layer may be planarized until the upper surface of the first mold layer is exposed to form the filling insulation pattern 122 and the channel 118.

An upper portion of the filling insulation pattern 122 may be partially removed to form an upper recess exposing an upper sidewall of the channel 118. An upper conductive pattern 124 may be formed to fill the upper recess. Thus, the vertical structure 126 may be formed in the channel hole 106.

Subsequently, the processes illustrated with reference to FIGS. 15, 16 and 1 may be performed in the same manner.

Therefore, the vertical semiconductor device as shown in FIG. 17 may be manufactured.

Figure 23:
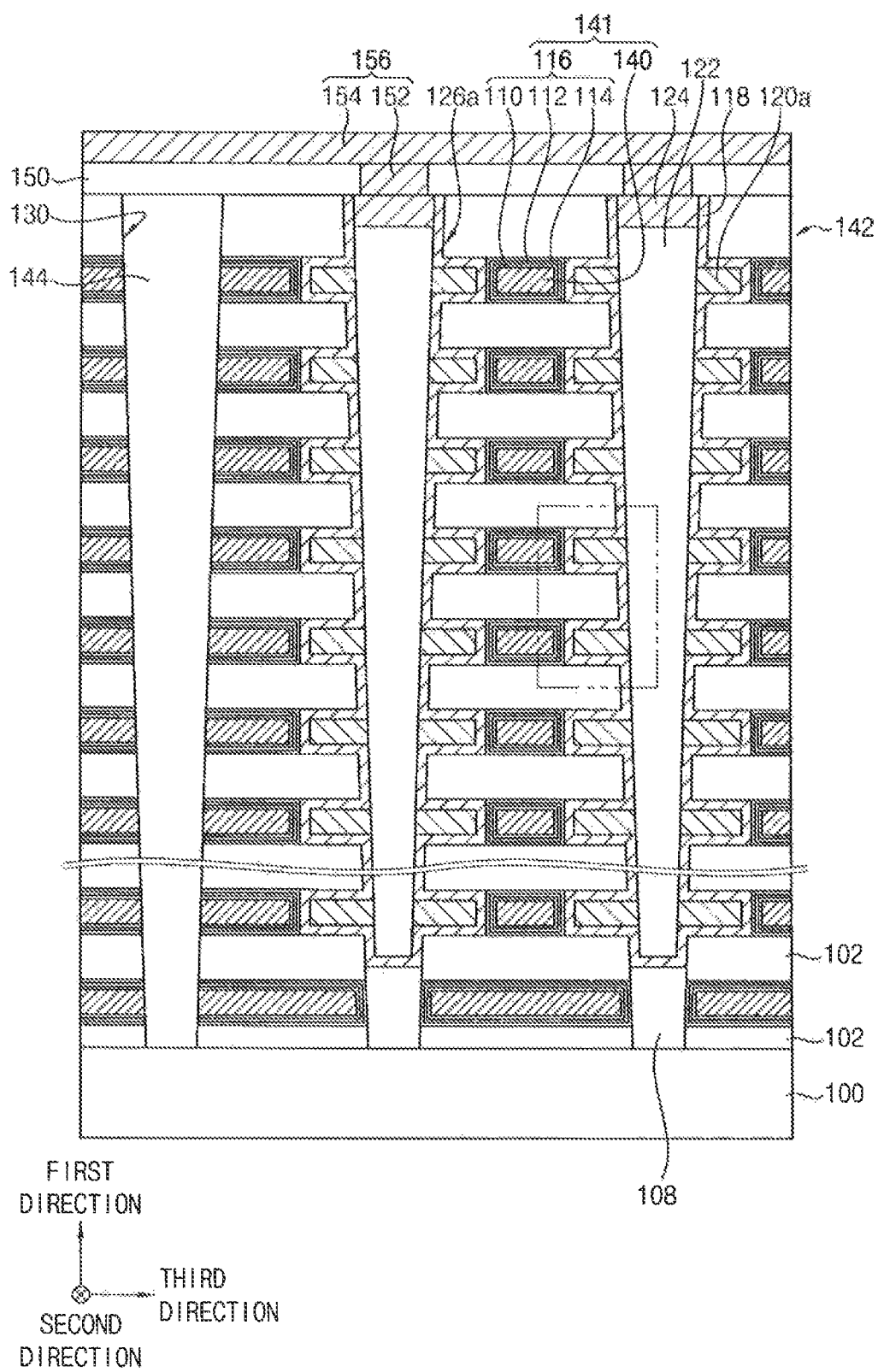
FIG. 23 is a cross-sectional view illustrating a vertical semiconductor device in accordance with an exemplary embodiment of the inventive concept.
Figure 24:
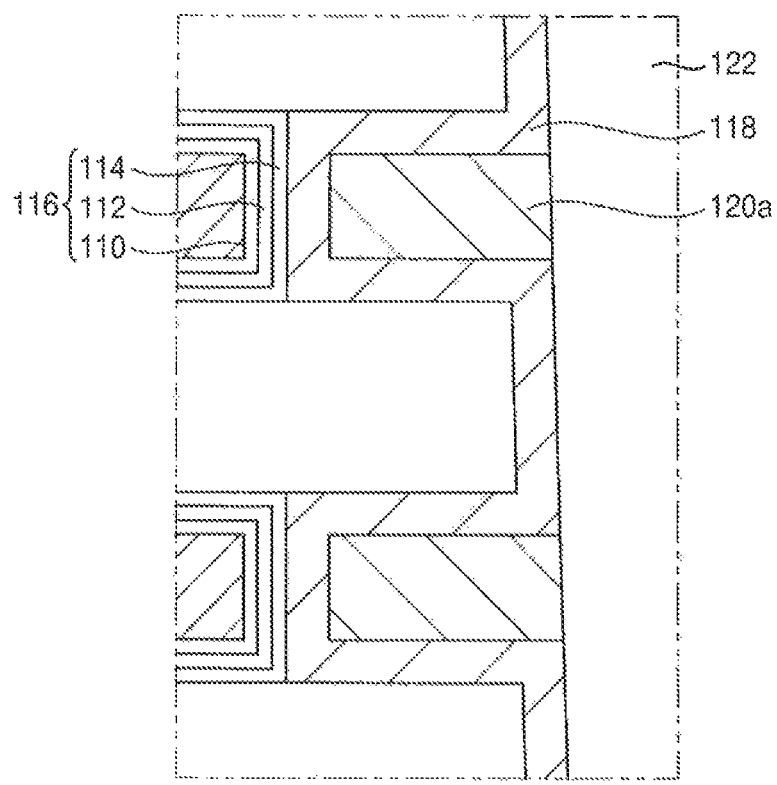
FIG. 24 is an enlarged cross-sectional view of a memory cell of a vertical semiconductor device in accordance with an exemplary embodiment of the inventive concept.

FIG. 23 is a cross-sectional view illustrating a vertical semiconductor device in accordance with an exemplary embodiment of the inventive concept. FIG. 24 is an enlarged cross-sectional view of a memory cell of the vertical semiconductor device in accordance with an exemplary embodiment of the inventive concept.

Referring to FIGS. 23 and 24, the vertical semiconductor device may include the stacked structure 142 formed on a substrate 100 and the vertical structures 126a including the channel 118 and passing through the stacked structure 142.

The stacked structure 142 may include the insulation layers 102 and the gate structures 141 alternately and repeatedly stacked. Thus, the gate structures 141 may be spaced apart from each other in the first direction.

The gate structure 141 may include a gate pattern 140 and a second data storage structure 116 surrounding the surface of the gate pattern 140. The second data storage structure 116 may include the blocking layer 110, the charge storage layer 112, and the tunnel insulation layer 114 sequentially stacked on the surface of the gate pattern 140.

The vertical structure 126a may pass through the stacked structure 142, and may have a pillar shape. The vertical structure 126a may include the channel 118, the first data storage structure 120a, the filling insulation pattern 122, and the upper conductive pattern 124.

The channel hole 106 (refer to FIG. 20) may extend to the upper surface of the substrate 100 through the stacked structure 142. The recess 107 (refer to FIG. 20) may be disposed at a portion from the sidewall of the channel hole 106 to the sidewall of the gate pattern 140. In other words, the recess 107 may be open through the sidewall of the channel hole 106, and a plurality of recesses 107 may be arranged in the first direction to be spaced apart from each other.

The vertical structure 126a may be formed in the channel hole 106 and the recess 107.

The channel 118 may be electrically connected to the substrate 100. The channel 118 may be conformally formed on the surfaces of the channel hole 106 and the recess 107, and may have a cylindrical shape.

The variable resistance pattern may be formed in each of the recesses 107, and may contact the channel 118. The variable resistance pattern may serve as the first data storage structure 120a.

The filling insulation pattern 122 may contact the first data storage structure 120a and the channel 118, and may fill most of a remaining portion of the channel hole 106.

As described above, the variable resistance patterns in the memory cells may be physically spaced apart from each other. Therefore, the vertical semiconductor device may have a circuit diagram substantially the same as the circuit diagram as shown in FIG. 19.

Hereinafter, a method of manufacturing the vertical type semiconductor device is briefly described.

First, processes the same as the processes illustrated with reference to FIG. 20 may be performed. Subsequently, the channel 118 and the variable resistance pattern may be formed in the channel hole 106 and the recess 107. In addition, the filling insulation pattern 122 and the upper conductive pattern 124 may be formed in the channel hole 106, so that the vertical structure may be formed.

Thereafter, the processes the same as the processes illustrated with reference to FIG. 15 may be performed to form the first trench 130 and the first gaps 132.

Then, referring to FIG. 23, the tunnel insulation layer 114, the charge storage layer 112, and the blocking layer 110 may be conformally formed in the first trench 130 and the first gaps 132. The gate electrode layer may be formed on the blocking layer 110 to fill the first gaps 132. Thereafter, the gate electrode layer formed in the first trench 130 may be selectively removed to form the gate pattern 140.

In exemplary embodiments of the inventive concept, the tunnel insulation layer 114, the charge storage layer 112, and the blocking layer 110 formed in the first trench 130 may be removed.

Thereafter, an insulation pattern 144 may be formed in the first trench 130.

Thus, the stacked structure 142 may be formed to include the insulation layer 102 and the gate structure 141 alternately and repeatedly stacked.

Subsequently, an upper insulation layer 150 and a bit line structure 156 are formed on the stacked structure 142. Thus, the vertical semiconductor device shown in FIG. 23 may be manufactured.

Figure 25:
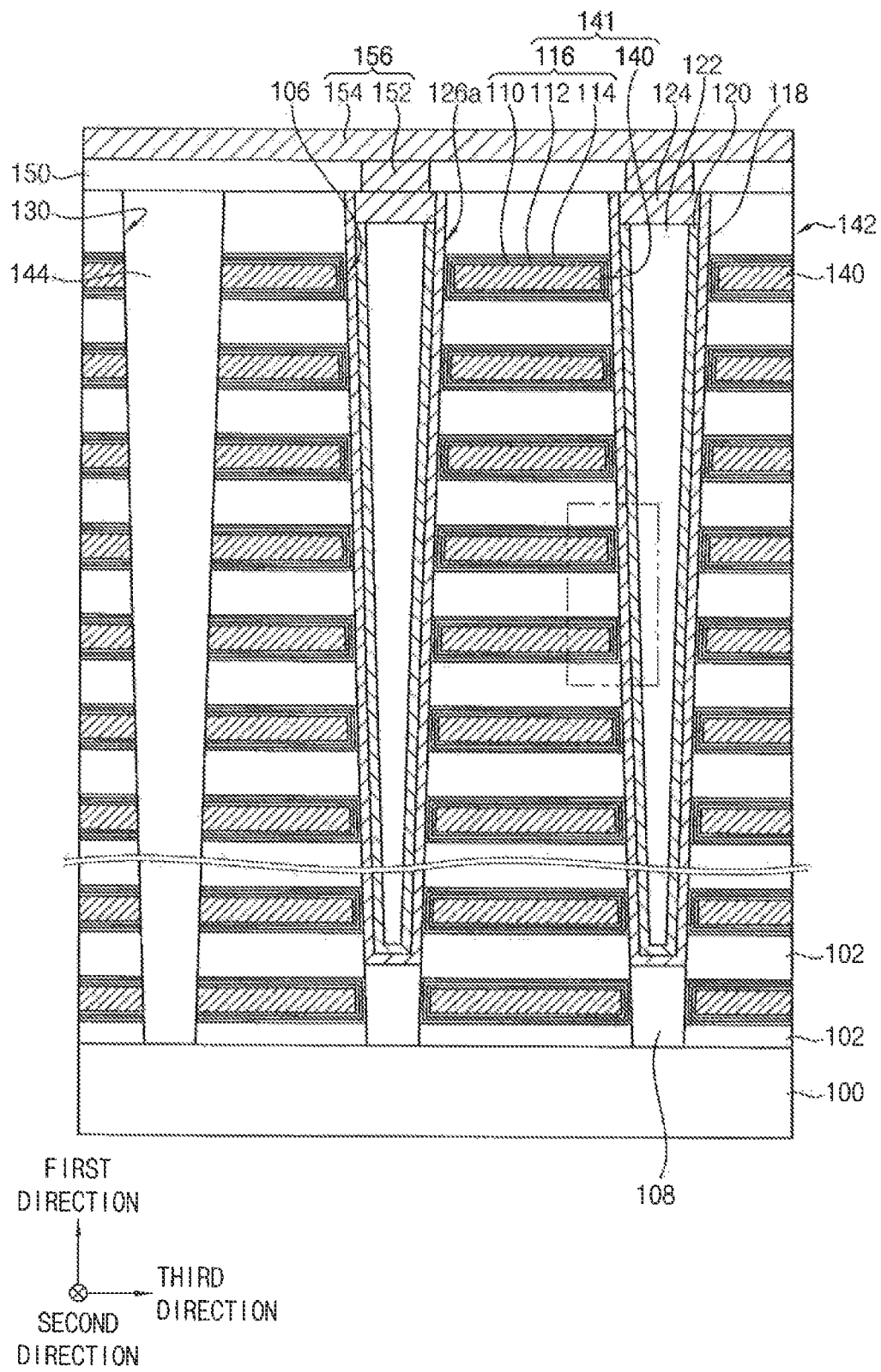
FIG. 25 is a cross-sectional view illustrating a vertical semiconductor device in accordance with an exemplary embodiment of the inventive concept.
Figure 26:
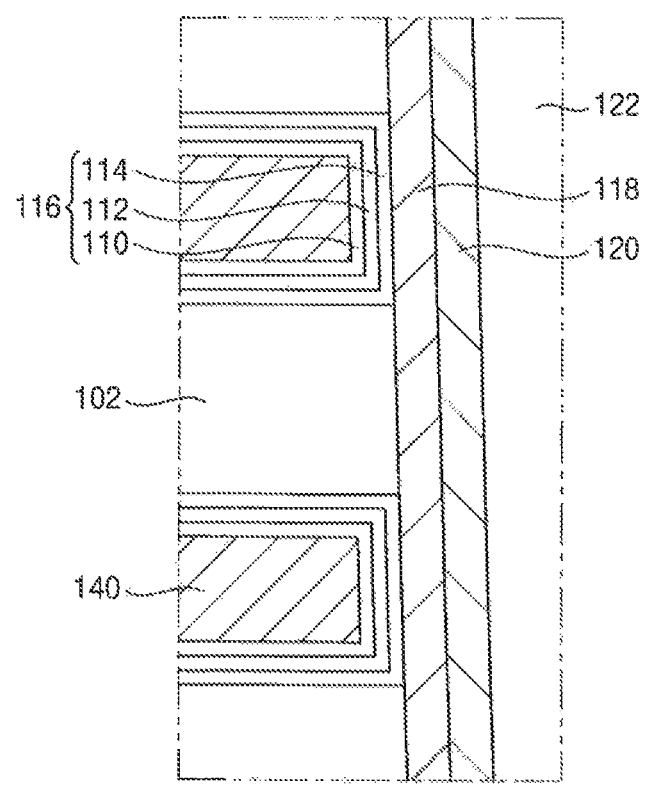
FIG. 26 is an enlarged cross-sectional view of a memory cell of a vertical semiconductor device in accordance with an exemplary embodiment of the inventive concept.

FIG. 25 is a cross-sectional view illustrating a vertical semiconductor device in accordance with an exemplary embodiment of the inventive concept. FIG. 26 is an enlarged cross-sectional view of a memory cell of a vertical semiconductor device in accordance with an exemplary embodiment of the inventive concept.

Referring to FIGS. 25 and 26, the vertical semiconductor device may include the stacked structure 142 formed on the substrate 100 and the vertical structure 126a including a channel 118 and passing through the stacked structure 142.

The stacked structure 142 may include the insulation layers 102 and the gate structures 141 alternately and repeatedly stacked. The stacked structure 142 may be substantially the same as the stacked structure shown in FIGS. 23 and 24.

A channel hole 106 may extend to the upper surface of the substrate 100 through the stacked structure 142.

The vertical structure 126a may include the channel 118, the first data storage structure 130, the filling insulation pattern 122, and the upper conductive pattern 124. The vertical structure 126a may be formed in the channel hole 106.

The channel 118 may be electrically connected to the substrate 100. The channel 118 may have a cylindrical shape in the channel hole 106.

The first data storage structure 120 may be formed on the channel 118. Thus, the first data storage structure 120 may have a cylindrical shape. The first data storage structure 120 may be the variable resistance layer.

The filling insulation pattern 122 may be formed on the first data storage structure 120 to fill most of a remaining portion of the channel hole 106.

As described above, the first data storage structures 120 of the memory cells in a cell string may be connected to each other in the first direction. Therefore, the vertical semiconductor device may have a circuit diagram substantially the same as the circuit diagram as shown in FIG. 3.

Hereinafter, a method of manufacturing the vertical type semiconductor device is briefly described.

First, processes the same as the processes illustrated with reference to FIG. 13 may be performed to form the channel hole 106 exposing the surface of the substrate 100 through the first mold layer. After forming the channel hole 106, the channel 118 and the first data storage structure 120 may be conformally formed on the surface of the channel hole 106. The filling insulation pattern 122 and the upper conductive pattern 124 may be formed in the channel hole, so that the vertical structure 126a may be formed.

Thereafter, the process as described with reference to FIG. 15 may be performed to form the first trench 130 and the first gaps 132.

Referring to FIG. 25, the tunnel insulation layer 114, the charge storage layer 112, and the blocking layer 110 may be conformally formed in the first trench 130 and the first gaps 132. The gate electrode layer may be formed on the blocking layer 110 to fill the first gaps 132. Thereafter, the gate electrode layer formed in the first trench 130 may be selectively removed to form the gate pattern 140. In exemplary embodiments of the inventive concept, the tunnel insulation layer 114, the charge storage layer 112, and the blocking layer 110 formed in the first trench 130 may be removed.

Thereafter, the insulation pattern 144 may be formed in the first trench 130.

Thus, the stacked structure 142 may be formed to include the insulation layer 102 and the gate structure 141 alternately and repeatedly stacked.

Subsequently, the upper insulation layer 150 and the bit line structure 156 may be formed on the stacked structure 142. Thus, the vertical semiconductor device shown in FIG. 25 may be manufactured.

Figure 27:
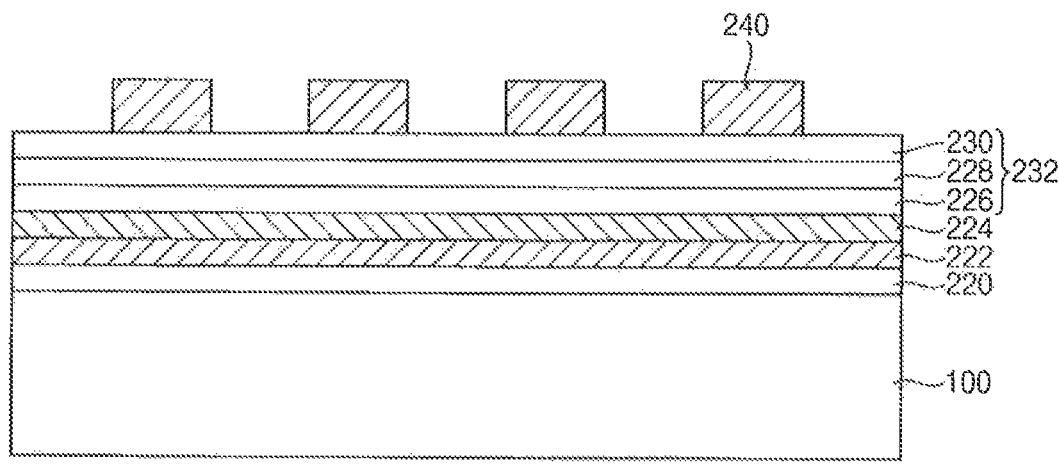
FIG. 27 is a cross-sectional view illustrating a semiconductor device in accordance with an exemplary embodiment of the inventive concept.
Figure 28:
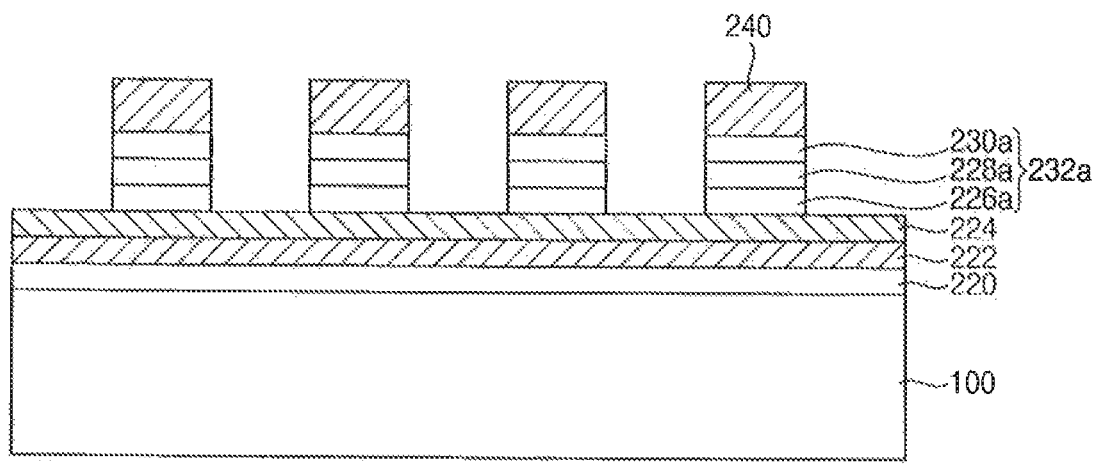
FIG. 28 is a cross-sectional view illustrating a semiconductor device in accordance with an exemplary embodiment of the inventive concept.

FIG. 27 is a cross-sectional view illustrating a semiconductor device in accordance with an exemplary embodiment of the inventive concept. FIG. 28 is a cross-sectional view illustrating a semiconductor device in accordance with an exemplary embodiment of the inventive concept.

Each of FIGS. 27 and 28 may be planar semiconductor device.

Referring to FIG. 27, the semiconductor device may include an insulation layer 220 on a substrate to cover an upper surface of the substrate 100.

A first data storage structure 222 may be formed on the insulation layer 220. The first data storage structure 222 may include a resistive switching material or a phase change material.

A channel 224 and a second data storage structure 232 may be formed on the first data storage structure 222. The second data storage structure 232 may include a blocking layer 226, a charge storage layer 228, and a tunnel insulation layer 230 sequentially stacked on the channel 224.

A gate pattern 240 may be formed on the second data storage structure 232.

In exemplary embodiments of the inventive concept, the first data storage structure 222 may extend in the third direction. In exemplary embodiments of the inventive concept, the channel 224 may extend in the third direction. In exemplary embodiments of the inventive concept, the channel 224 may cover the insulation layer 220 and the first data storage structure 222.

In exemplary embodiments of the inventive concept, the second data storage structure 232 may extend in the third direction.

In exemplary embodiments of the inventive concept, as shown in FIG. 28, the second data storage structure 232a may have an isolated shape. In other words, the second data storage structure 232a may include the blocking pattern 226a, the charge storage pattern 228a, and the tunnel insulation pattern 230a sequentially stacked on the channel 224.

The gate pattern 240 may extend in the second direction. A plurality of the gate patterns 240 may be spaced apart in the third direction.

A stack of the memory cells of the semiconductor device shown in FIG. 27 may be similar to the stack of the memory cells of the vertical semiconductor device illustrated with reference to FIGS. 1 and 2.

Figure 29:
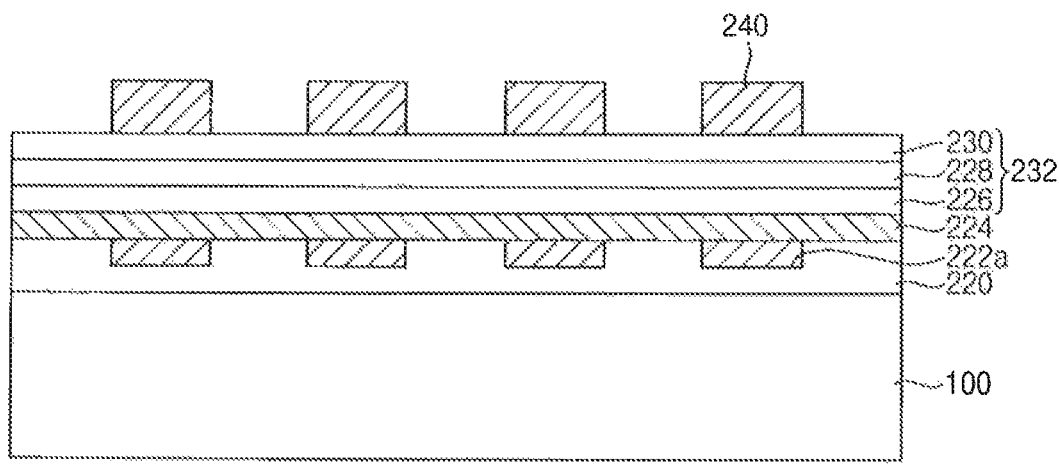
FIG. 29 is a cross-sectional view illustrating a semiconductor device in accordance with an exemplary embodiment of the inventive concept.
Figure 30:
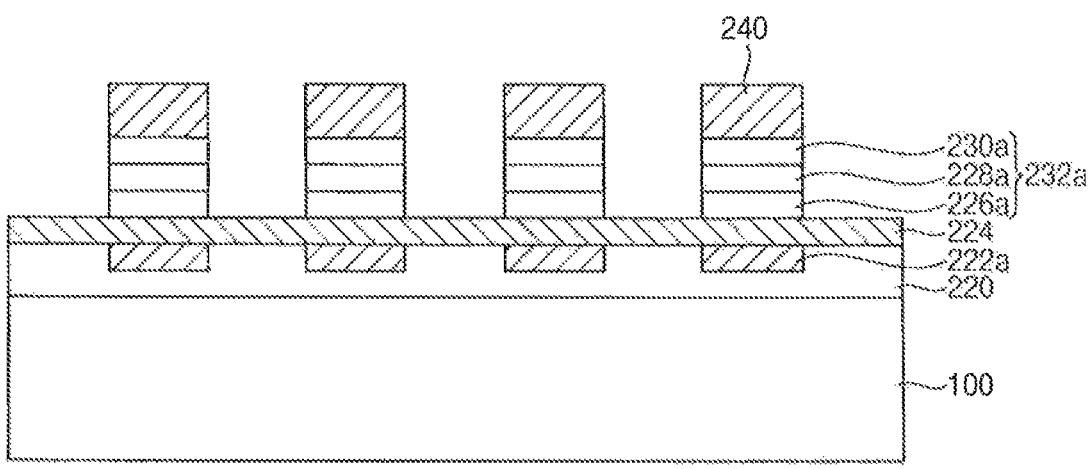
FIG. 30 is a cross-sectional view illustrating a semiconductor device in accordance with an exemplary embodiment of the inventive concept.

FIG. 29 is a cross-sectional view illustrating a semiconductor device in accordance with an exemplary embodiment of the inventive concept. FIG. 30 is a cross-sectional view illustrating a semiconductor device in accordance with an exemplary embodiment of the inventive concept.

Each of FIGS. 29 and 30 may be may be planar semiconductor device.

Referring to FIG. 29, the semiconductor device may include the insulation layer 220 on the substrate 100 to cover the substrate 100. The first data storage structure 222a, the channel 224 and the second data storage structure 232 may be formed on the insulation layer 220. In addition, the gate pattern 240 may formed on the second data storage structure 232.

In exemplary embodiments of the inventive concept, the first data storage structure 222a may have an isolated pattern shape.

In exemplary embodiments of the inventive concept, the first data storage structure 222a may be formed in a recess included in the insulation layer 220. Therefore, an upper surface of the first data storage structure 222a and an upper surface of the insulation layer 220 may be coplanar with each other. In exemplary embodiments of the inventive concept, the first data storage structure 222a may be formed on a planar upper surface of the insulation layer 220. In this case, the upper surface of the first data storage structure 222a may protrude from the upper surface of the insulation layer 220.

In exemplary embodiments of the inventive concept, the channel 224 may extend in the third direction. In exemplary embodiments of the inventive concept, the channel 224 may cover the insulation layer 220 and the first data storage structure 222a.

In exemplary embodiments of the inventive concept, the second data storage structure 232 may extend in the third direction. In exemplary embodiments of the inventive concept, as shown in FIG. 30, the second data storage structure 232a may have an isolated shape. In other words, the second data storage structure 232a may include the blocking pattern 226a, the charge storage pattern 228a, and the tunnel insulation pattern 230a sequentially stacked on the channel 224.

The gate pattern 240 may extend in the second direction. The plurality of the gate patterns 240 may be spaced apart in the third direction.

In the cases of the planar semiconductor devices, data may be stored in the each of first and second data storage structures of the memory cell, and stored data may be separately read in the same manner as the vertical semiconductor device.

Each of the semiconductor devices shown in FIGS. 27 to 30 may perform a write operation and read operation in substantially the same as manner described with reference to FIGS. 4 to 12.

The semiconductor device according to exemplary embodiments of the inventive concept may include two data storage structures in one memory cell, so that the number of stored data in the one memory cell may be increased. In addition, the number of data states required for the number of stored data in the one memory cell may be reduced. Furthermore, in the semiconductor device, data stored in each of the first and second data storage structures in the one memory cell may be separately read.

While the inventive concept has been shown and described with reference to exemplary embodiments thereof, it will be apparent to those of ordinary skill in the art that various modifications in form and details may be made thereto without departing from the spirit and scope of the inventive concept as set forth by the following claims.

What is claimed is:

1. A vertical semiconductor device, comprising:
   a channel on a substrate, the channel extending in a first direction substantially perpendicular to an upper surface of the substrate;
   a first data storage structure contacting a first sidewall of the channel;
   a second data storage structure on a second sidewall of the channel; and
   gate patterns on a surface of the second data storage structure, wherein the gate patterns are spaced apart from each other in the first direction, and the gate patterns extend in a second direction substantially parallel to the upper surface of the substrate.

2. The vertical semiconductor device of claim 1, wherein the first data storage structure includes a variable resistance material.

3. The vertical semiconductor device of claim wherein the first data storage structure includes STO (SrTiO3), BTO (BaTiO3), PCMO (Pr1-XCaXMnO3), zirconium oxide, hafnium oxide, hafnium aluminum oxide, hafnium silicon oxide, aluminum oxide, titanium oxide or tantalum oxide.

4. The vertical semiconductor device of claim 1, wherein the first data storage structure includes a GeSe material or a phase change material including germanium (Ge), antimony (Sb), or tellurium (Te).

5. The vertical semiconductor device of claim 1, wherein the second data storage structure includes a tunnel insulation layer, a charge storage layer, and a blocking layer.

6. The vertical semiconductor device of claim 5, wherein the charge storage layer is a floating, layer including silicon.

7. The vertical semiconductor device of claim 5, wherein the charge storage layer is a charge trap layer including a silicon nitride or a metal nitride.

8. The vertical semiconductor device of claim 1, wherein the first data storage structure covers the first sidewall of the channel.

9. The vertical semiconductor device of claim 1, wherein a plurality of first data storage structures are spaced apart from each other in the first direction, and the first data storage structures face each other in a horizontal direction with respect to the upper surface of the substrate.

10. The vertical semiconductor device of claim 1, wherein data are stored in the first data storage structure and the second data storage structure, respectively, by electric fields in different directions.

11. The vertical semiconductor device of claim 1, wherein first data is stored in the first data storage structure by electric fields in a direction substantially parallel to the first sidewall of the channel, and second data is stored in the second data storage structure by electric fields in a direction substantially perpendicular to the first sidewall of the channel.

12. The vertical semiconductor device of claim 1, wherein the second data storage structure contacts a portion of the surface of the gate patterns.

13. The vertical semiconductor device of claim 12, wherein the second data storage structure surrounds the surface of the gate patterns.

14. A vertical semiconductor device, comprising:
   gate patterns stacked on a substrate, wherein the gate patterns are spaced apart from each other in a first direction substantially perpendicular to an upper surface of the substrate, and the gate patterns extend in a second direction substantially parallel to the upper surface of the substrate;
   a channel passing through the gate patterns, wherein the channel is electrically connected to the substrate, and the channel has a cylindrical shape;
   a first data storage structure contacting a first sidewall of the channel; and
   a second data storage structure on a second sidewall of the channel opposite the first sidewall, wherein the second data storage structure contacts the channel.

15. The vertical semiconductor device of claim 14, wherein the first data storage structure includes a variable resistance material.

16. The vertical semiconductor device of claim 14, wherein the second data storage structure includes a tunnel insulation layer, a charge storage layer, and a blocking layer.

17. The vertical semiconductor device of claim 14, wherein first data is stored in the first data storage structure by electric fields in a direction substantially parallel to the first sidewall of the channel, and second data is stored in the second data storage structure by electric fields in a direction substantially perpendicular to the first sidewall of the channel.

18. A vertical semiconductor device, comprising:
   a first gate pattern and a second gate pattern arranged in a vertical direction on a substrate, wherein an insulation layer is disposed between the first gate pattern and the second gate pattern;
   a channel layer disposed on the substrate;
   a first data storage element disposed on a first side of the Channel layer; and
   a second data storage element disposed on a second side of the channel layer, wherein the second data storage element is disposed between the second side of the channel layer and the first gate pattern.

19. The vertical semiconductor device of claim 18, wherein the channel layer directly contacts the first data storage element and the second data storage element.

20. The vertical semiconductor device of claim 18, wherein the first data storage element and the second data storage element include different materials from each other.

* * * * *